United States Patent
Takahashi

(10) Patent No.: US 7,582,918 B2
(45) Date of Patent: Sep. 1, 2009

(54) SEMICONDUCTOR DEVICE WITH ENHANCED BREAKDOWN VOLTAGE

(75) Inventor: Tetsuo Takahashi, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 14 days.

(21) Appl. No.: 10/981,509

(22) Filed: Nov. 5, 2004

(65) Prior Publication Data

US 2005/0167694 A1    Aug. 4, 2005

(30) Foreign Application Priority Data

Jan. 29, 2004  (JP) .............................. 2004-021476

(51) Int. Cl.
*H01L 29/74* (2006.01)
(52) U.S. Cl. ................ 257/127; 257/170; 257/407; 257/605; 257/E29.012
(58) Field of Classification Search ................ 257/127, 257/328, 170, 605, E29.012, 407
See application file for complete search history.

(56) References Cited

U.S. PATENT DOCUMENTS

| | | | | |
|---|---|---|---|---|
| 5,324,971 A | * | 6/1994 | Notley | 257/328 |
| 6,365,930 B1 | * | 4/2002 | Schillaci et al. | 257/339 |
| 6,614,088 B1 | * | 9/2003 | Beasom | 257/489 |
| 2003/0160262 A1 | * | 8/2003 | Kitada et al. | 257/127 |

FOREIGN PATENT DOCUMENTS

| | | |
|---|---|---|
| JP | 10-163482 | 6/1998 |
| JP | 3191747 | 5/2001 |
| JP | 3331846 | 7/2002 |
| JP | 2003-188381 | 7/2003 |

* cited by examiner

*Primary Examiner*—Wael Fahmy
*Assistant Examiner*—John C Ingham
(74) *Attorney, Agent, or Firm*—Buchanan Ingersoll & Rooney PC

(57) ABSTRACT

In a peripheral portion of an IGBT chip, an intermediate potential electrode (20) is provided between a field plate (14) and a field plate (15) on a field oxide film (13), to surround an IGBT cell. The intermediate potential electrode (20) is supplied with a prescribed intermediate potential between the potentials at an emitter electrode (10) and a channel stopper electrode (12) from intermediate potential applying means that is formed locally in a partial region on the chip peripheral portion.

6 Claims, 22 Drawing Sheets

F I G . 1 A
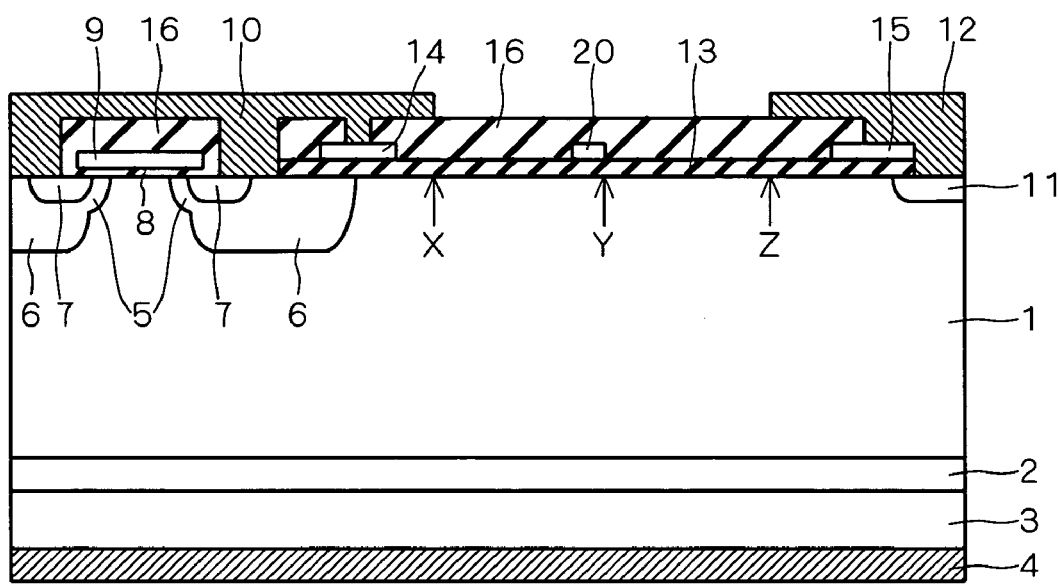
F I G . 1 B
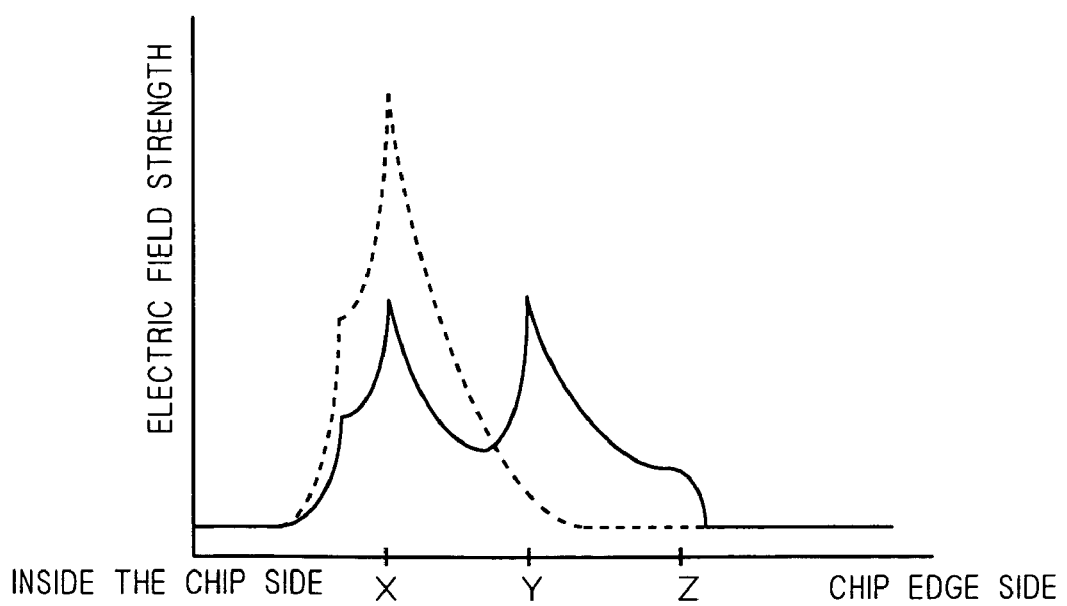

F I G . 2
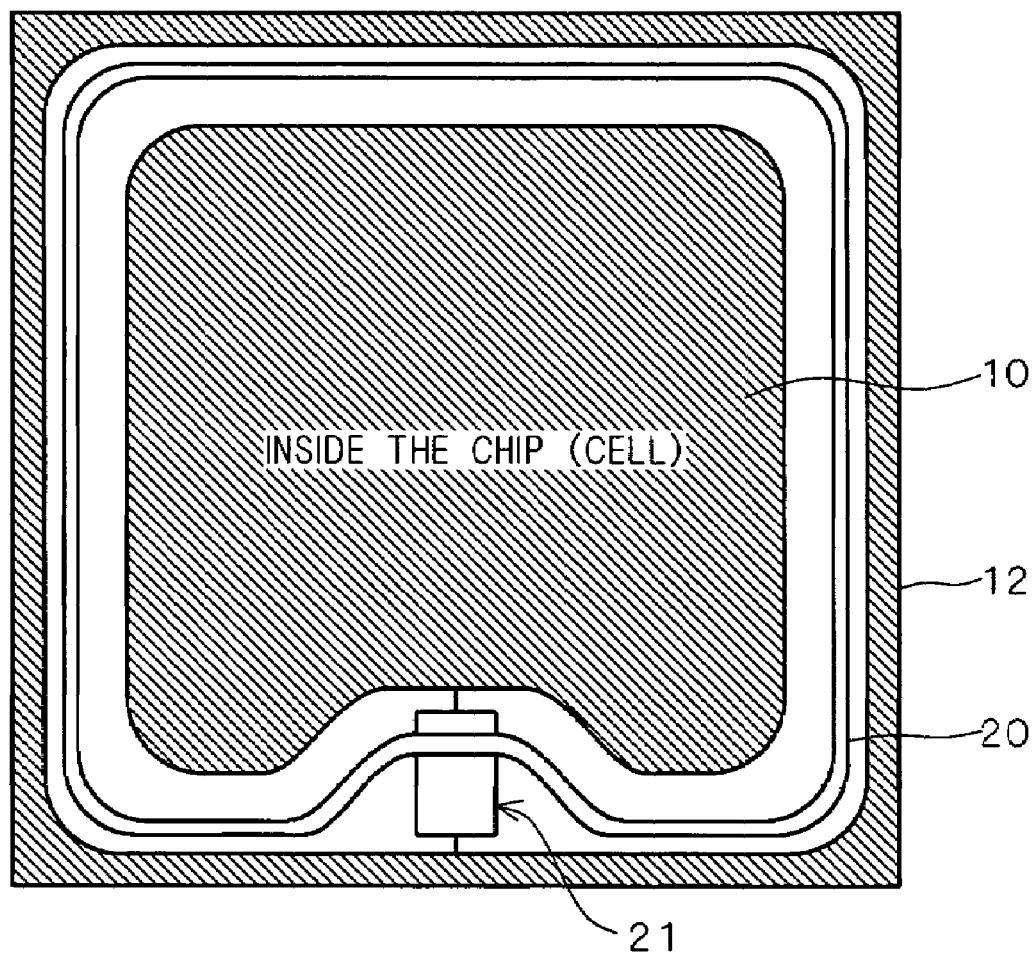

F I G . 8
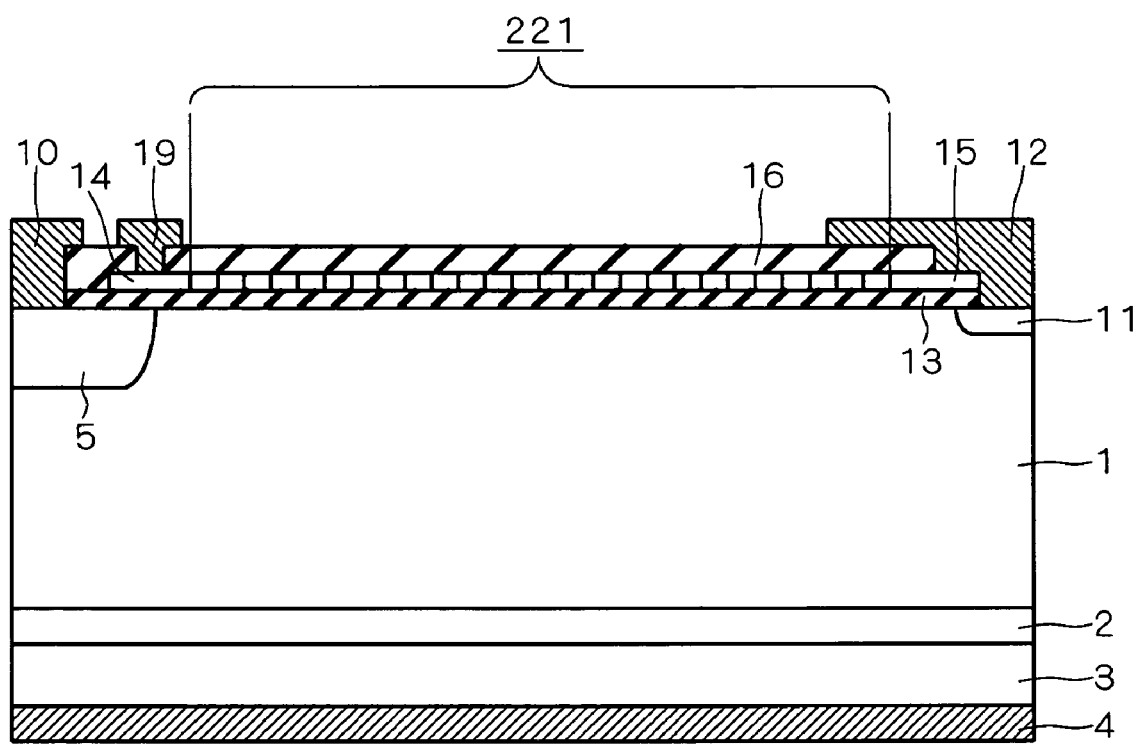

F I G . 1 6 A
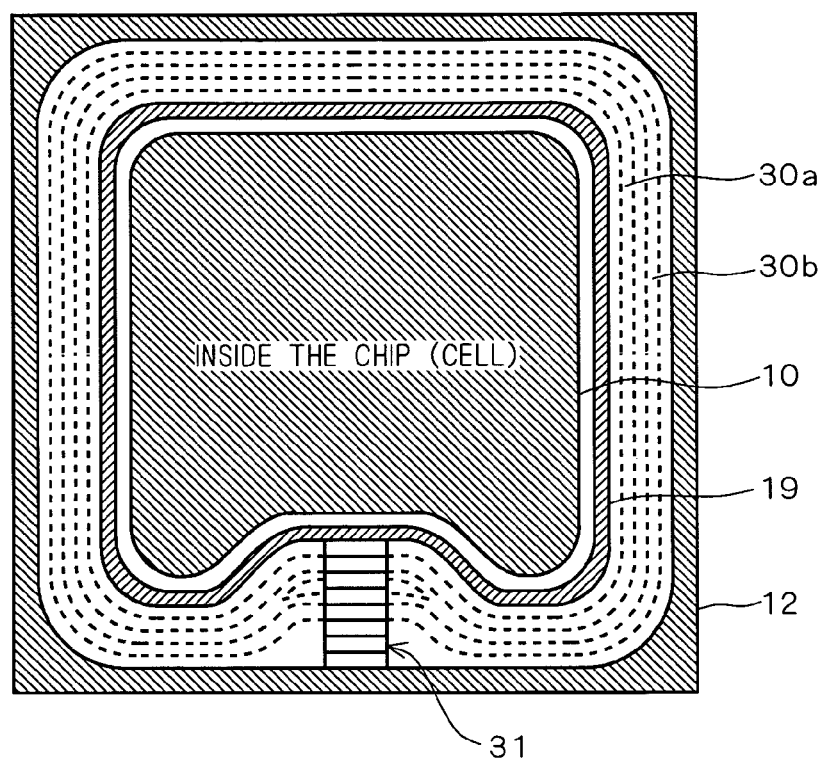
F I G . 1 6 B
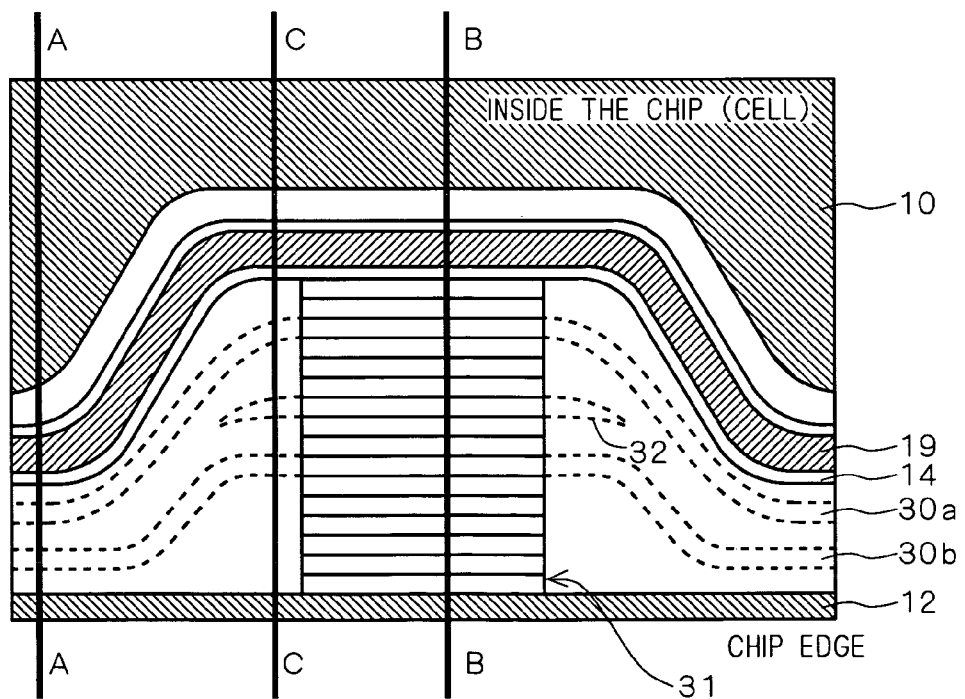

$L_N = W_G$ $L_N > W_G$

SEMICONDUCTOR DEVICE WITH ENHANCED BREAKDOWN VOLTAGE

BACKGROUND OF THE INVENTION

1. Field of the Invention

This invention relates to semiconductor devices, and in particular to techniques for stabilizing and enhancing breakdown voltage of semiconductor devices.

2. Description of the Background Art

It is generally required that power semiconductor device have high capability of holding breakdown voltage, namely, stability improvements in and enhancements of breakdown voltage are desired. Techniques known to accomplish this objective include a field plate, a guard ring, and a structure combining those elements (e.g. Japanese Patent Application Laid-Open No. 2003-188381). In another technique, diodes that are connected back-to-back with one another (back-to-back diode) are disposed between the gate and collector of an IGBT (insulated gate bipolar transistor) to thereby prevent an overvoltage from being applied between the collector and emitter (e.g. Japanese Patent No. 3191747 (2001)). Also known are a semiconductor device structure combining the back-to-back diode and guard ring (e.g. Japanese Patent No. 3331846 (2002)), and a semiconductor device structure combining the back-to-back diode and field plate (e.g. Japanese Patent Application Laid-Open No. 10-163482 (1998)).

A field plate structure is generally capable of achieving a high breakdown voltage of a semiconductor device with a small area. However, being formed on a substrate, a field plate is susceptible to polarization of a resin and the like for molding a chip top surface (mold polarization), which leads to breakdown voltage fluctuations and so on to cause the breakdown voltage to be unstable. A guard ring structure, although being capable of obtaining a stabilized breakdown voltage compared to the field plate structure, needs a larger forming area than that for the field plate structure. Besides, in a semiconductor device structure combining a back-to-back diode and guard ring, a potential difference develops easily between a region below the back-to-back diode and the remaining region in the guard ring, which leads to an unstable breakdown voltage.

In the above JP 10-163482 (1998), a group of ring-shaped field plates (equipotential rings) are formed via an insulating film on a silicon substrate around an IGBT (insulated gate bi-polar transistor) forming region on an IGBT chip, and belt-shaped back-to-back diodes are disposed in a ring shape between each of the equipotential rings to connect between the rings. In short the back-to-back diodes are formed on the whole periphery of the chip, giving a problem of an increase in forming area for the field plate structure. Moreover, since the directions of the back-to-back diodes become the one along each of the equipotential rings, the potentials at the back-to-back diodes vary to the direction along the chip periphery. This makes the potential at the chip peripheral portion unstable, which results in an unstable breakdown voltage easily.

Also in the IGBT disclosed in the JP 10-163482 (1998), the back-to-back diodes break down to pass a current between the gate and collector when the voltage between the collector and emitter exceeds a prescribed value. Consequently, a gate electrode potential increases to render the IGBT into the ON state (conduction state), thereby preventing an overvoltage from being applied between the collector and emitter. The back-to-back diodes thus need to have a certain degree of width for passing the breakdown current. However, the above problems (increase in forming area for the field plate structure, and instability of the potential at the chip peripheral portion) become more pronounced with the widening of the diodes, and a too much widening will make it difficult to maintain a high breakdown voltage or will increase a leakage current. Therefore, there is a maximum width of the back-to-back diodes, which constitutes a restriction on chip design.

SUMMARY OF THE INVENTION

It is an object of this invention to provide a semiconductor device capable of achieving size reduction while maintaining a high breakdown voltage.

This invention is applicable to a semiconductor device including a semiconductor element formed on a semiconductor substrate, and a peripheral structure provided around the semiconductor element. The peripheral structure includes a first electrode formed on a peripheral portion of the peripheral structure and electrically connected to the semiconductor substrate, an insulating film formed on the semiconductor substrate between a forming region of the semiconductor element and the first electrode, and an intermediate potential electrode formed on the insulating film to surround the semiconductor element.

A semiconductor device according to a first aspect of this invention includes intermediate potential applying means that applies a prescribed intermediate potential to the intermediate potential electrode, the prescribed intermediate potential being between the potentials at the first electrode and a second electrode that is the outermost electrode on the semiconductor substrate in the semiconductor element. The intermediate potential applying means is formed locally in a partial region on the insulating film.

Because the intermediate potential applying means is provided locally in a partial region on the insulating film, the width of the remaining region on the chip peripheral structure can be reduced. And because a high breakdown voltage on the chip peripheral structure is achieved by the intermediate potential electrode, deterioration of the breakdown voltage can be suppressed even with the width reduction of the chip peripheral structure. In short, this invention helps achieve a high degree of integration and size reduction of the semiconductor device while maintaining the breakdown voltage.

A semiconductor device according to a second aspect of this invention includes a multistage back-to-back diode formed locally in a partial region on the insulating film and connected between the first electrode and a second electrode that is the outermost electrode on the semiconductor substrate in the semiconductor element, a guard ring formed in the semiconductor substrate to surround the semiconductor element, and an impurity region formed locally in a region including the vicinity of the back-to-back diode in the semiconductor substrate, the impurity region being of line shape and of the same conductivity type as the guard ring.

Because the back-to-back diode is provided locally in a partial region on the insulating film, the width of the remaining region on the chip peripheral structure can be reduced. Further, although it is difficult to match potentials between the back-to-back diode and the guard ring in the region where the back-to-back diode is formed, the line-shaped impurity region being formed in that region relieves electric field concentration, thus suppressing deterioration of the breakdown voltage.

A semiconductor device according to a third aspect of this invention includes a multistage back-to-back diode formed locally in a partial region on the insulating film and connected between the first electrode and a second electrode that is the outermost electrode on the semiconductor substrate in the semiconductor element, and a guard ring formed in the semiconductor substrate to surround the semiconductor element. When a breakdown voltage of the multistage back-to-back diode is applied between the first and second electrodes, the back-to-back diode positioned above the guard ring holds a voltage of 60 V or below.

Because the back-to-back diode positioned above the guard ring holds a voltage of 60 V or below, a potential difference between the guard rings and the back-to-back diode is suppressed, thereby relieving electric field concentration and suppressing deterioration of the breakdown voltage.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1A illustrates the configuration of a semiconductor device according to a first preferred embodiment, and FIG. 1B illustrates electric field distribution on a chip peripheral portion of the semiconductor device;

FIGS. 2, 3A, and 3B are to views of a chip of the semiconductor device according to the first preferred embodiment;

FIG. 8 illustrates the configuration of the semiconductor device according to the second preferred embodiment;

FIGS. 16A and 16B are top views of a chip of the semiconductor device according to the fifth preferred embodiment;

DESCRIPTION OF THE PREFERRED EMBODIMENTS

First Preferred Embodiment

Figure 3A:
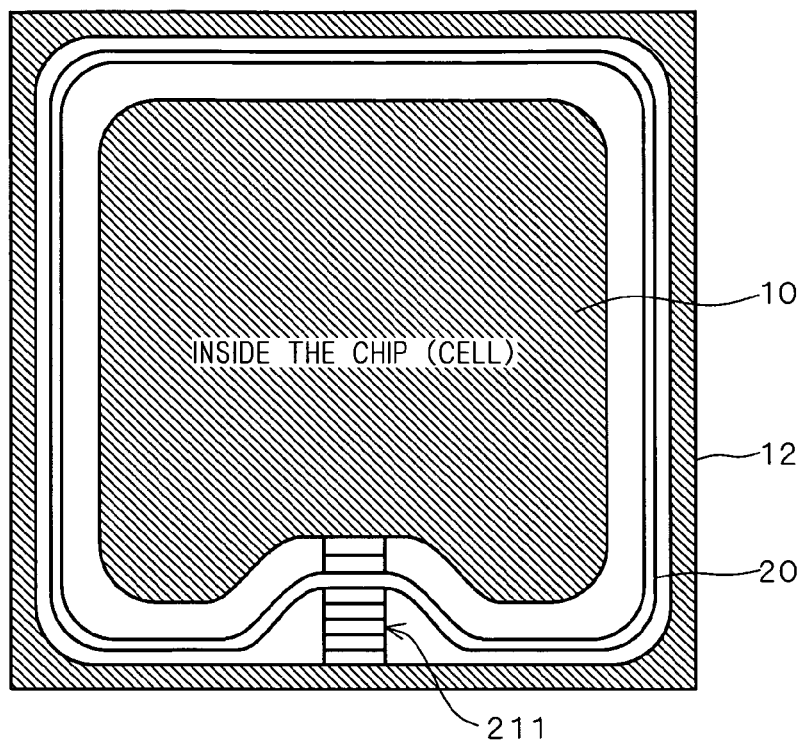

FIG. 1A illustrates the configuration of a semiconductor device according to a first preferred embodiment of this invention, which is a peripheral portion of a vertical IGBT chip. The left side portion of FIG. 1A is a region where an IGBT is formed as a semiconductor element for performing current switching, a cell portion of the IGBT. This portion is configured in a similar fashion as a typical IGBT. That is, on the under surface side of an $n^-$ drift layer 1, a $p^+$ collector region 3 is formed via an $n^+$ buffer layer 2 having lower resistance than the $n^-$ drift layer 1. A collector electrode 4 is provided on the under surface of the $p^+$ collector region 3. In a surface layer on the top surface side of the $n^-$ drift layer 1, a p base region 5 is formed and, in order to prevent latchup of a parasitic thyristor, a $p^+$ isolation well 6 is formed to overlap part of the p base region 5, the $p^+$ isolation well 6 being of higher concentration and diffused deeper than the p base region 5. An $N^+$ emitter region 7 is selectively formed in a surface layer of the p base region 5. Further, a gate electrode 9 made of polysilicon is provided via a gate oxide film 8 on the surfaces of the p base region 5 sandwiched between the $n^+$ emitter region 7 and the $n^-$ drift layer 1. An interlayer insulating film 16 is formed on the chip, whereon an emitter electrode 10 is formed to contact both surfaces of the p base region 5 and the $n^+$ emitter region 7. In this example, the emitter electrode 10 is the outermost electrode (second electrode) on the substrate in the IGBT cell. The IGBT is thus formed.

On the other hand, the right side portion of FIG. 1A is a peripheral structure of this semiconductor device, means for improving the breakdown voltage of the semiconductor device. The right edge of FIG. 1A is the edge of the IGBT chip (chip edge), where an $n^+$ type channel stopper layer 11 is formed in the surface layer of the $n^-$ drift layer 1, whereon a channel stopper electrode 12 (first electrode) is formed to be connected to the channel stopper layer 11. Since the channel stopper electrode 12 and the channel stopper layer 11 are nearly equal in potential to the collector electrode 4, the voltage applied between the collector and emitter is held at a portion (hereinafter referred to as a "chip peripheral portion") between the $p^+$ isolation well 6 in the IGBT cell portion and the channel stopper layer 11. The chip peripheral portion is required to have a sufficient isolation breakdown voltage particularly during the OFF state (cut-off state) of the IGBT when a high voltage is applied between the collector and emitter.

Note that in the IGBT structure shown in FIG. 1A and other Figures of the drawing described in this specification, the collector side (the channel stopper layer 11 and channel stopper electrode 12 side) has a higher potential when the IGBT is OFF. For the sake of simplicity, the IGBT cell side (inside the chip side) in the chip peripheral portion is hereinafter referred to as a "low voltage side", and the channel stopper layer 11 and channel stopper electrode 12 side (chip edge side) as a "high voltage side".

The first preferred embodiment improves the breakdown voltage by adopting a field plate structure in the chip peripheral portion. That is, a field oxide film 13 is formed on the top surface of the silicon substrate in the chip peripheral portion, whereon a field plate 14 on the low voltage side is formed over the boundary between the $p^+$ isolation well 6 and the $n^-$ drift layer 1, and a field plate 15 on the high voltage side is formed over the boundary between the $n^-$ drift layer 1 and the channel stopper layer 11. By setting the field plate 14 to have a lower potential than the silicon substrate surface therebelow, a depletion layer extends easily from a pn junction between the $n^-$ drift layer 1 and the $p^+$ isolation well 6 toward inside the $n^-$ drift layer 1 on the high voltage side. This relieves electric field concentration in the vicinity of the pn junction, thereby improving the breakdown voltage in the chip peripheral portion. In this example, the field plate 14 is connected to the emitter electrode 10, and the field plate 15 to the channel stopper electrode 12.

Also in the first preferred embodiment, an intermediate potential electrode 20 is provided between the field plates 14 and 15 on the field oxide film 13, to surround the IGBT cell. The electrode 20 is supplied with a prescribed intermediate potential between the potentials at the channel stopper electrode 12 (first electrode) and the emitter electrode 10 (second electrode) from intermediate potential applying means (described later in detail) that is formed locally in a partial region on the chip peripheral portion. When, with the potential at the collector electrode 4 (potential at the channel stopper electrode 12) being higher than the emitter electrode 10, the electrode 20 is set to have a lower potential than the silicon substrate surface therebelow, a depletion layer extends easily in the $n^-$ drift layer 1 in the chip peripheral portion. Conversely, when the electrode 20 is set to have a higher potential than the silicon substrate surface therebelow, extension of a depletion layer is suppressed in the $n^-$ drift layer 1 in the chip peripheral portion.

In the first preferred embodiment, the electrode 20 is supplied with a lower potential than the silicon substrate surface therebelow, so that a depletion layer extends easily in the $n^-$ drift layer 1 in the chip peripheral portion. FIG. 1B illustrates the action of the electrode 20 in the first preferred embodiment, showing electric field distribution on the silicon substrate surface in the chip peripheral portion when the IGBT is in a cut off state and a voltage is applied such that the collector electrode 4 has a higher potential than the emitter electrode 10. The solid line graph represents the electric field distribution on the semiconductor device according to the first preferred embodiment as shown in FIG. 1A, whereas the dotted line graph represents the same in a conventional semiconductor device (one without the electrode 20 in FIG. 1A), both of which are applied with the same voltage. Symbols X, Y, and Z shown in FIG. 1B correspond to points X (below the high voltage side edge of the emitter electrode 10), Y (below the high voltage side edge of the electrode 20), and Z (below the low voltage side edge of the channel stopper electrode 12) as shown in FIG. 1A, respectively.

As shown in FIG. 1B, in the conventional semiconductor device without the electrode 20, an electric field peak (electric field concentration) appears at one point of the point X, because the conventional device has no means to relieve the electric field by extending a depletion layer from the point X toward the high voltage side. On the other hand, in the semiconductor device according to the first preferred embodiment where a depletion layer extends easily due to the action of the electrode 20, electric field peaks appear at two points of the points X and Y, each peak being smaller than the conventional one.

Breakdown occurs when the peak of electric field strength in the chip peripheral portion reaches a value (generally known as $2\times10^5$ V/cm) that causes impact ionization, which makes the then collector voltage the breakdown voltage limit of the semiconductor device. As shown in FIG. 1B, in the semiconductor device according to the first preferred embodiment where the peak value of electric field is suppressed low, breakdown hardly occurs in the chip peripheral portion. In short, a high breakdown voltage of the semiconductor device is achieved by the provision of the intermediate potential electrode 20.

The intermediate potential applying means for applying a prescribed intermediate potential to the intermediate potential electrode 20 will now be described. FIG. 2 is a top view of the chip of the semiconductor device according to the first preferred embodiment, where elements identical to those in FIG. 1A are denoted by like reference numbers. As shown in FIG. 2, the electrode 20 is disposed in the chip peripheral portion to surround the cell region. The electrode 20 is applied with a prescribed intermediate potential from intermediate potential applying means 21 that is formed locally in a partial region on the chip peripheral portion.

Figure 3B:
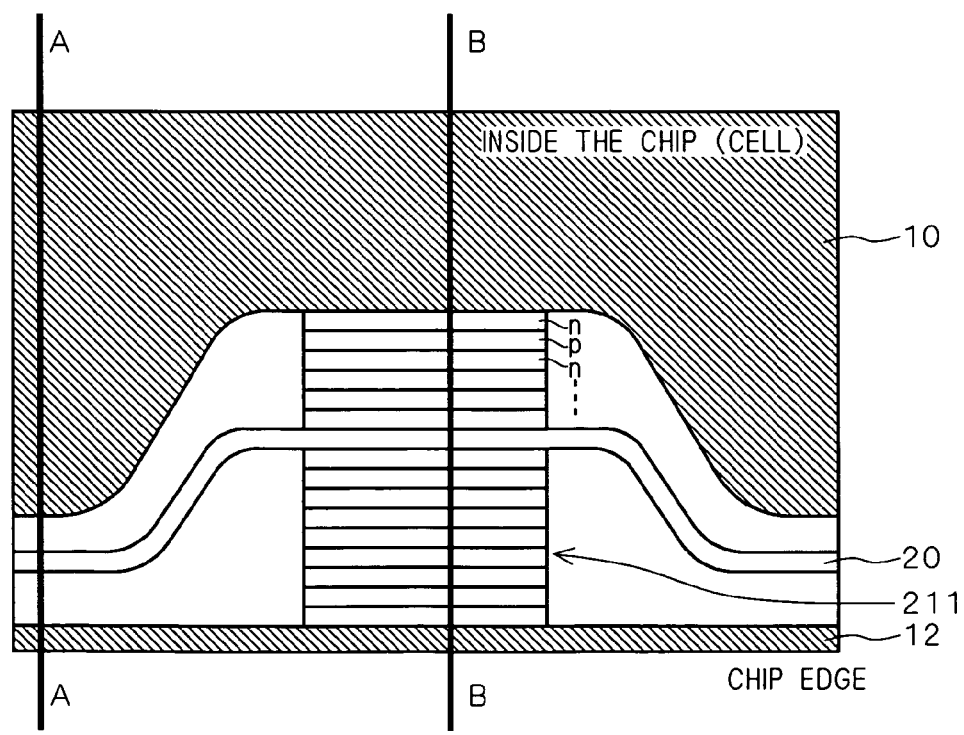
Figure 4:
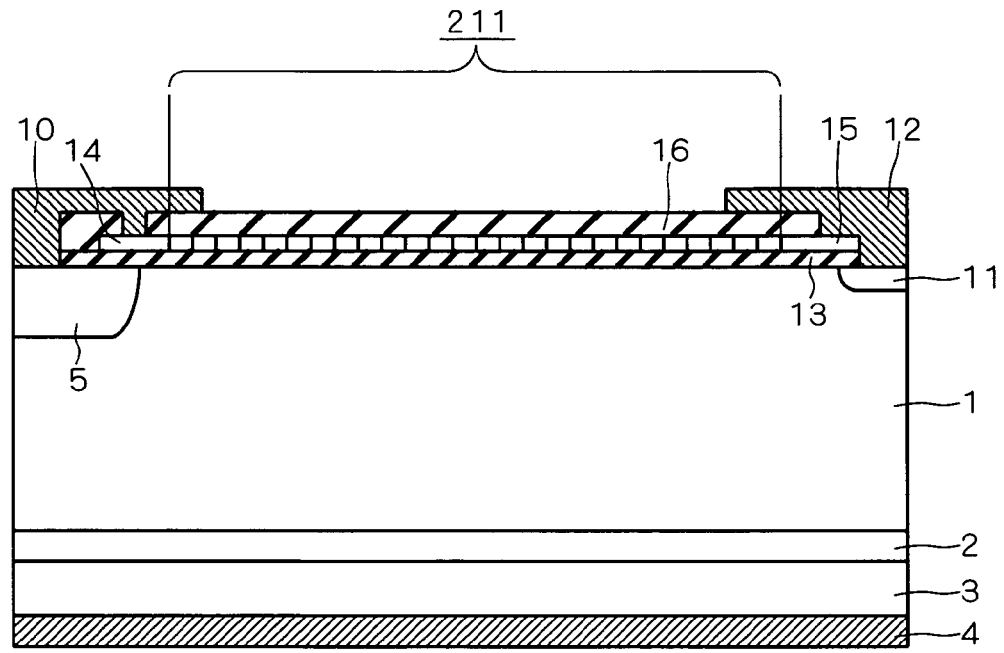
FIG. 4 illustrates the configuration of the semiconductor device according to the first preferred embodiment.

FIGS. 3A and 3B illustrate a concrete example of the intermediate potential applying means 21. FIG. 3A is a top view of the whole chip of the semiconductor device. In this example, the intermediate potential applying means 21 is connected between the emitter electrode 10 and the channel stopper electrode 12, and is a multistage back-to-back diode including a plurality of diodes in series that are connected back-to-back (this multistage back-to-back diode is hereinafter collectively referred to as a "back-to-back diode 211"). FIG. 3B is an enlarged view of a portion where the back-to-back diode 211 is formed in FIG. 3A. The back-to-back diode 211 is formed by alternately disposing p-type region and n-type region on polysilicon formed on the field oxide film 13. FIG. 1A is a cross-sectional view taken along the line A-A of FIG. 3B, and FIG. 4 along the line B-B. Again in FIG. 4, elements identical to those in FIGS. 1A and 3B are denoted by like reference numbers.

The voltage between the emitter electrode 10 and the channel stopper electrode 12 is shared and held by each individual diode within the back-to-back diode 211. Namely, the back-to-back diode 211 functions as voltage dividing means. And as shown in FIG. 3B, the electrode 20 is made of polysilicon drawn out from a prescribed diode within the multistage back-to-back diode 211. In short the electrode 20 is connected to a diode of one prescribed stage among the back-to-back diode 211.

Assuming that the collector potential (potential at the channel stopper electrode 12) is $V_{CE}$ with reference to the emitter potential, the number of the whole stages of the back-to-back diode 211 is N, and the electrode 20 is drawn out from the "i-th" diode from the emitter electrode 10 side, then a potential $V_i$ at the electrode 20 will be:

$$V_i = V_{CE} \times i/N$$

Accordingly, the potential at the electrode 20 can be set arbitrarily by adjusting the position in the back-to-back diode 211 from which the electrode 20 is to be drawn out.

For instance, when the electrode 20 is supplied with a lower potential than the silicon substrate surface therebelow, as in the first preferred embodiment, the electrode 20 should be disposed on the field plate 15 side from a position that divides between the field plates 14 and 15 internally with "i:N−i". Alternatively, the electrode 20 may be disposed on a position that divides between the field plates 14 and 15 internally with "j N−j" while making "i" smaller than "j".

Because the back-to-back diode 211 for determining the potential at the electrode 20 is formed locally in a partial region on the chip peripheral portion, the width of the remaining region on the chip peripheral portion can be reduced. And because the electrode 20 facilitates extension of a depletion layer in the chip peripheral portion thus achieving a high breakdown voltage, deterioration of the breakdown voltage can be suppressed even with the width reduction of the chip peripheral portion. In short, this invention helps achieve a high degree of integration and size reduction of the semiconductor device while maintaining the breakdown voltage. Further, since the back-to-back diode 211 to which the electrode 20 is connected is formed locally in a partial region on the chip peripheral portion, current leakage is suppressed.

Moreover, the provision of the electrode 20 produces the effect of suppressing influence by the mold polarization. When the electrode 20 is not provided, for instance, the way a depletion layer extends in the n⁻ drift layer 1 is susceptible to moving charge inside a mold resin for molding the chip. On the other hand, in the first preferred embodiment, extension of a depletion layer is facilitated in the n⁻ drift layer 1 below the electrode 20 irrespective of the state of the moving charge inside the mold resin. Influence by an electric field outside the device is also suppressed. In short, the breakdown voltage of the semiconductor device can be stabilized.

While the single intermediate potential electrode 20 lies almost at the center between the field plates 14 and 15 in FIG. 1A, the electrode 20 may alternatively be disposed on the field plate 14 side from the center, to facilitate extension of a depletion layer effectively, as in the first preferred embodiment.

The electrode 20 according to the first preferred embodiment can be formed simultaneously in the steps of forming the field plates 14 and 15 in a method of forming a conventional semiconductor device, by changing its pattern shape. The back-to-back diode 211 can too be formed in the step of forming a back-to-back diode in the method of forming a conventional semiconductor device, by changing its pattern shape. In short, there is no increase in the number of steps included in the method of manufacturing a conventional semiconductor device.

Second Preferred Embodiment

Figure 5:
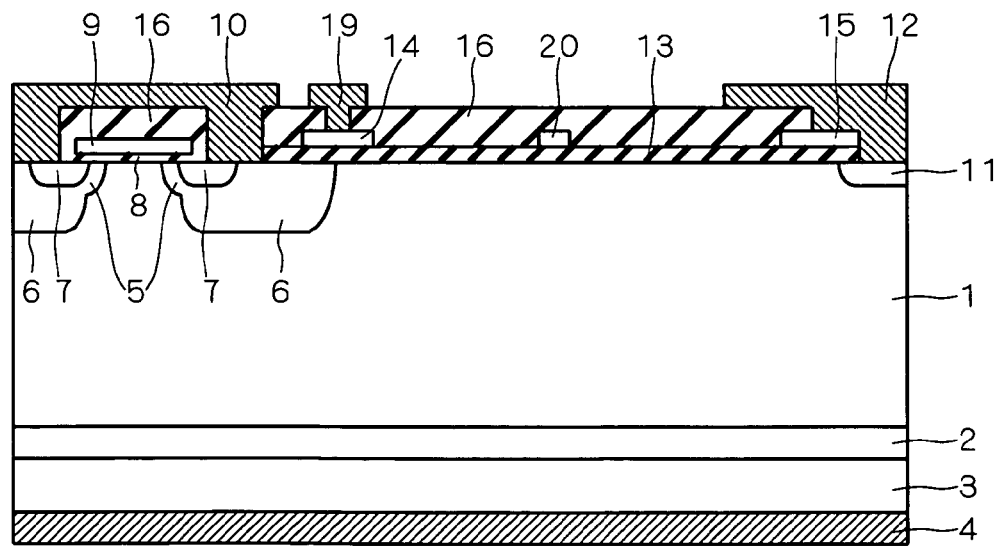
FIG. 5 illustrates the configuration of a semiconductor device according to a second preferred embodiment.

FIG. 5 illustrates the configuration of a semiconductor device according to a second preferred embodiment of this invention, which is different from that shown in FIG. 1A in that a gate wiring 19 is connected to the field plate 14 on the low voltage side. Although not shown, the gate wiring 19 is electrically connected to the gate electrode 9. Namely, the field plate 14 and the gate electrode 9 are equal in potential. In FIG. 5, elements identical to those in FIG. 1A are denoted by like reference numbers, and descriptions thereof will thus be omitted. In this example, the outermost electrode (second electrode) on the substrate in the IGBT cell is the gate wiring 19.

Again in the FIG. 5 semiconductor device, there is provided the intermediate potential electrode 20 between the field plates 14 and 15 on the field oxide film 13. The electrode 20 is supplied with a lower intermediate potential than the silicon substrate surface therebelow from the intermediate potential applying means, so that a depletion layer extends easily in the n⁻ drift layer 1 in the chip peripheral portion. This produces similar effects as those explained in the first preferred embodiment with reference to FIG. 1B where breakdown hardly occurs in the chip peripheral portion, thereby achieving a high breakdown voltage of the semiconductor device.

Figure 6:
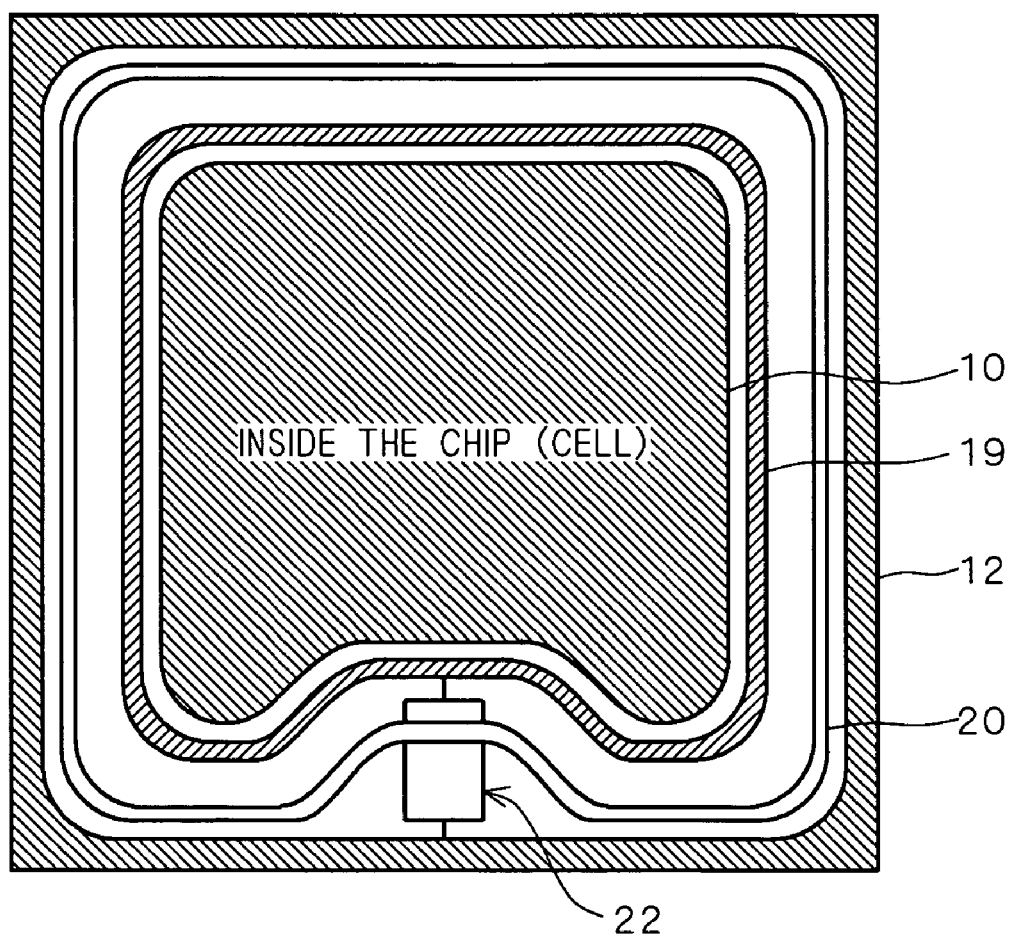
FIGS. 6, 7A, and 7B are top views of a chip of the semiconductor device according to the second preferred embodiment.

The intermediate potential applying means according to the second preferred embodiment for applying a prescribed intermediate potential to the electrode 20 will now be described. FIG. 6 is a top view of the chip of the semiconductor device, where elements identical to those in FIG. 5 are denoted by like reference numbers. The electrode 20 is applied with a prescribed intermediate potential from intermediate potential applying means 22 that is formed locally in a partial region on the chip peripheral portion.

Figure 7A:
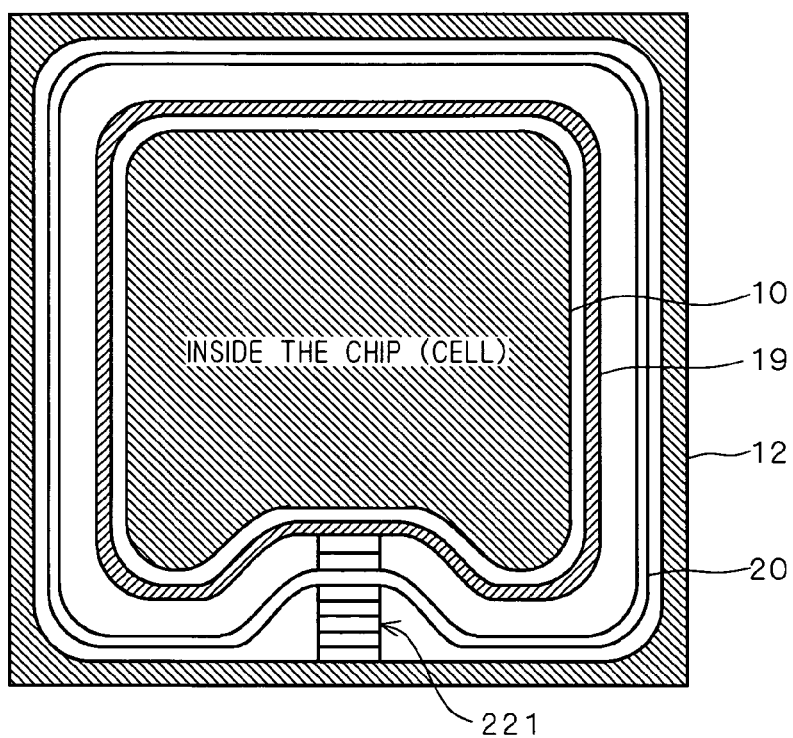
Figure 7B:
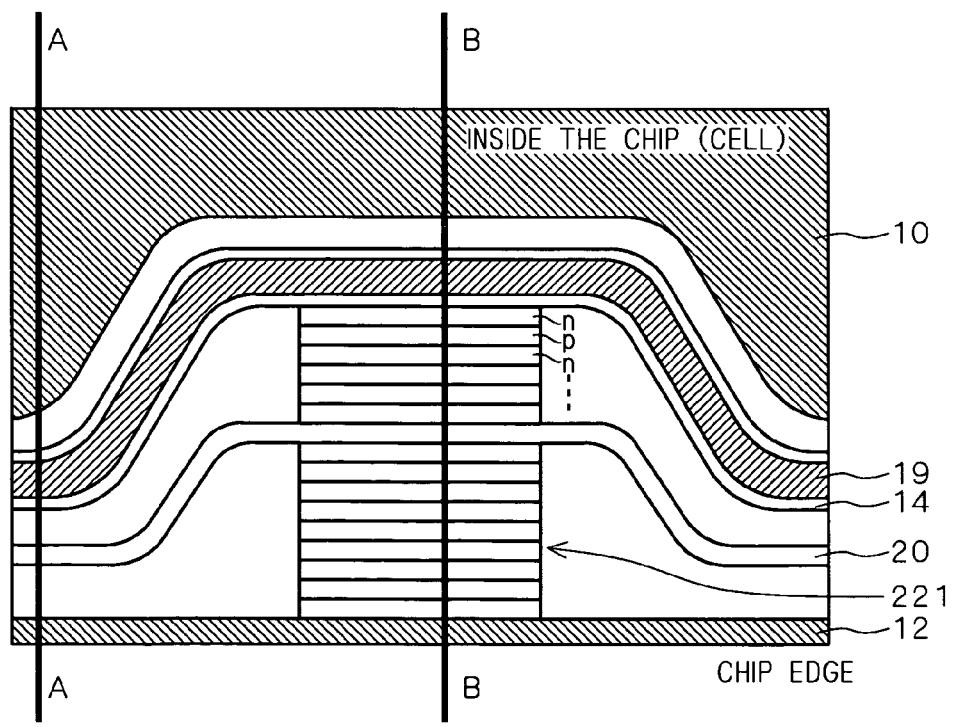

FIGS. 7A and 7B illustrate a concrete example of the intermediate potential applying means 22. FIG. 7A is a top view of the whole chip of the semiconductor device. In this example, the intermediate potential applying means 22 is connected between the gate wiring 19 and the channel stopper electrode 12, and is a multistage back-to-back diode including a plurality of diodes in series that are connected back-to-back (this multistage back-to-back diode is hereinafter collectively referred to as a "back-to-back diode 221"). FIG. 7B is an enlarged view of a portion where the back-to-back diode 221 is formed in FIG. 7A. The back-to-back diode 221 is formed by alternately disposing p-type region and n-type region on polysilicon formed on the field oxide film 13. The above FIG. 5 is a cross-sectional view taken along the line A-A of FIG. 7B, and FIG. 8 along the line B-B. Again in FIG. 8, elements identical to those in FIGS. 5 and 7B are denoted by like reference numbers.

The voltage between the gate wiring 19 and the channel stopper electrode 12 is shared and held by each individual diode within the back-to-back diode 221. Namely, the back-to-back diode 221 functions as voltage dividing means. And as shown in FIG. 7B, the electrode 20 is made of polysilicon drawn out from a prescribed diode within the multistage back-to-back diode 221. In short the electrode 20 is connected to a diode of one prescribed stage among the back-to-back diode 221.

Assuming that the collector potential (potential at the channel stopper electrode 12) is $V_{CE}$ and the gate potential (potential at the gate wiring 19) is $V_{GE}$ with reference to the emitter potential, the back-to-back diode 221 holds a voltage $V_{CE}-V_{GE}$. Here, if wet the number of the whole stages of the back-to-back diodes 221 be N, and assume that the electrode 20 is drawn out from the "i-th" diode from the gate wiring 19 side, then a potential $V_i$ at the electrode 20 will be:

$$V_i = (V_{CE} - V_{GE}) \times i/N$$

Since $V_{GE}$ is usually small compared to $V_{CE}$, it can assumed that:

$$V_i \approx V_{CE} \times i/N$$

Accordingly, the potential at the electrode 20 can be set arbitrarily by adjusting the position in the back-to-back diode 221 from which the electrode 20 is to be drawn out.

For instance, when the electrode 20 is supplied with a lower potential than the silicon substrate surface therebelow, as in the second preferred embodiment, the electrode 20 should be disposed on the field plate 15 side from a position that divides between the field plates 14 and 15 internally with "i:N−i". Alternatively, the electrode 20 may be disposed on a position that divides between the field plates 14 and 15 internally with "j:N−j" while making "i" smaller than "j".

Because the back-to-back diode 221 for determining the potential at the electrode 20 is only formed partially on the chip peripheral portion, the width of the remaining region on the chip peripheral portion can be reduced. And because a high breakdown voltage is achieved due to the action of the electrode 20, deterioration of the breakdown voltage can be suppressed even with the width reduction of the chip peripheral portion. In short, this invention helps achieve a high degree of integration and size reduction of the semiconductor device while maintaining the breakdown voltage.

Moreover, the provision of the electrode 20 suppresses influence by the mold polarization or an electric field outside the device, as in the first preferred embodiment, thereby stabilizing the breakdown voltage of the semiconductor device.

Further in the second preferred embodiment, the breakdown voltage of the back-to-back diode 221 is set to have a lower value than the breakdown voltage within the silicon substrate between the emitter electrode 10 and the channel stopper electrode 12 (breakdown voltage between the n$^+$ emitter region 7 and the channel stopper layer 11). For this reason, the back-to-back diode 221 breaks down to pass a current when the voltage between the collector and emitter exceeds the breakdown voltage of the diode 221. Consequently, the gate electrode potential increases to render the IGBT into the ON state (conduction state). Accordingly, the so-called overvoltage protection capability that prevents an overvoltage from being applied between the collector and emitter is obtained.

Again in the second preferred embodiment, the electrode 20 should be disposed on the field plate 14 side from the center, to facilitate extension of a depletion layer effectively. Besides, the semiconductor device according to the second preferred embodiment can too be formed in the steps of forming a field plate and a back-to-back diode in a method of forming a conventional semiconductor device, by changing their pattern shapes, which results in no increase in the number of steps included in the method of manufacturing a conventional semiconductor device.

Third Preferred Embodiment

Figure 9A:
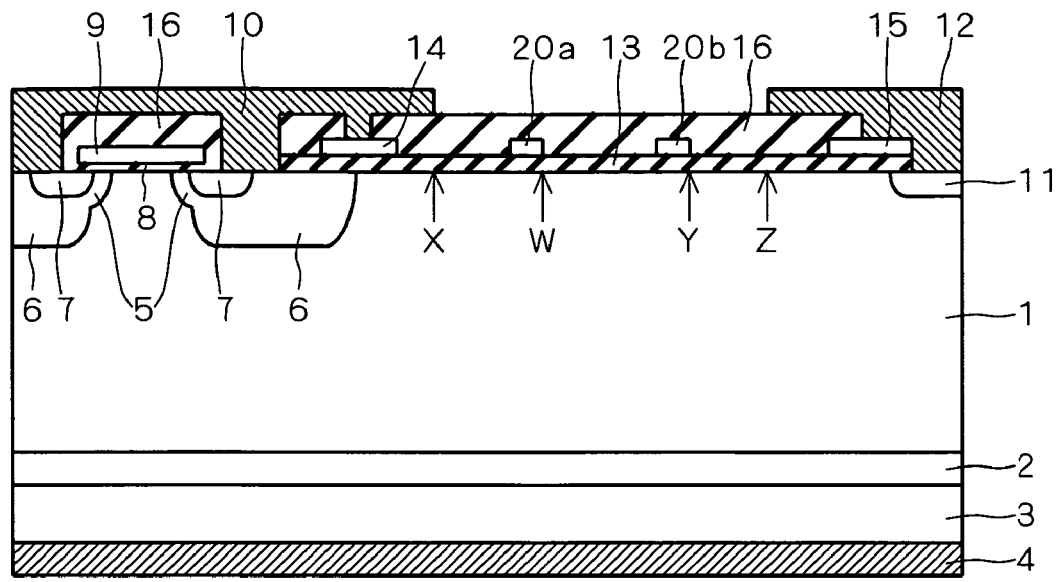
FIG. 9A illustrates the configuration of a semiconductor device according to a third preferred embodiment.

In a third preferred embodiment of this invention, a plurality of intermediate potential electrodes are provided on the chip peripheral portion. For instance, FIG. 9A illustrates the semiconductor device according to the first preferred embodiment including two intermediate potential electrodes 20*a* and 20*b*. The other components in FIG. 9A are identical to those in FIG. 1A, and detailed descriptions of FIG. 9A will thus be omitted.

When, with the potential at the collector electrode 4 (potential at the channel stopper electrode 12) being higher than the emitter electrode 10, the electrodes 20*a* and 20*b* are set to have a lower potential than the silicon substrate surface therebelow, a depletion layer extends easily in the n$^-$ drift layer 1 in the chip peripheral portion below the respective electrodes 20*a* and 20*b*. Conversely, when the electrodes 20*a* and 20*b* are set to have a higher potential than the silicon substrate surface therebelow, extension of a depletion layer is suppressed in the n$^-$ drift layer 1 below the respective electrodes 20*a* and 20*b*.

For instance, the electrode 20*a* on the low voltage side should be set to have a lower potential than the silicon substrate surface therebelow, because a depletion layer is required to extend easily in the vicinity of the p$^+$ isolation well 6 in order to suppress electric field concentration. On the other hand, the electrode 20*b* on the high voltage side needs to be set to have a lower potential than the silicon substrate surface below its high voltage side edge, when used to facilitate extension of a depletion layer in the n$^-$ drift layer 1, for instance. Conversely, the electrode 20*b* needs to be set to have a higher potential than the silicon substrate surface below its high voltage side edge thus suppressing extension of a depletion layer, when used to avert a problem such as an unstable breakdown voltage due to overextension of the depletion layer toward the channel stopper layer 11 side resulting from the mold polarization and the like.

For instance, when the two electrodes 20*a* and 20*b* are provided as shown in FIG. 9A, with points W (below the high voltage side edge of the electrode 20*a*) and Y (below the high voltage side edge of the electrode 20*b*) being equally disposed between the points X (below the high voltage side edge of the emitter electrode 10) and Z (below the low voltage side edge of the channel stopper electrode 12), the electrode 20*a* should be set to have a potential one-third or below the voltage between the emitter and collector. On the other hand, the electrode 20*b* should be set to have a potential two-thirds or below the voltage between the emitter and collector when used to facilitate extension of a depletion layer, or a potential higher than two-thirds the voltage between the emitter and collector when used to suppress extension of a depletion layer.

Figure 9B:
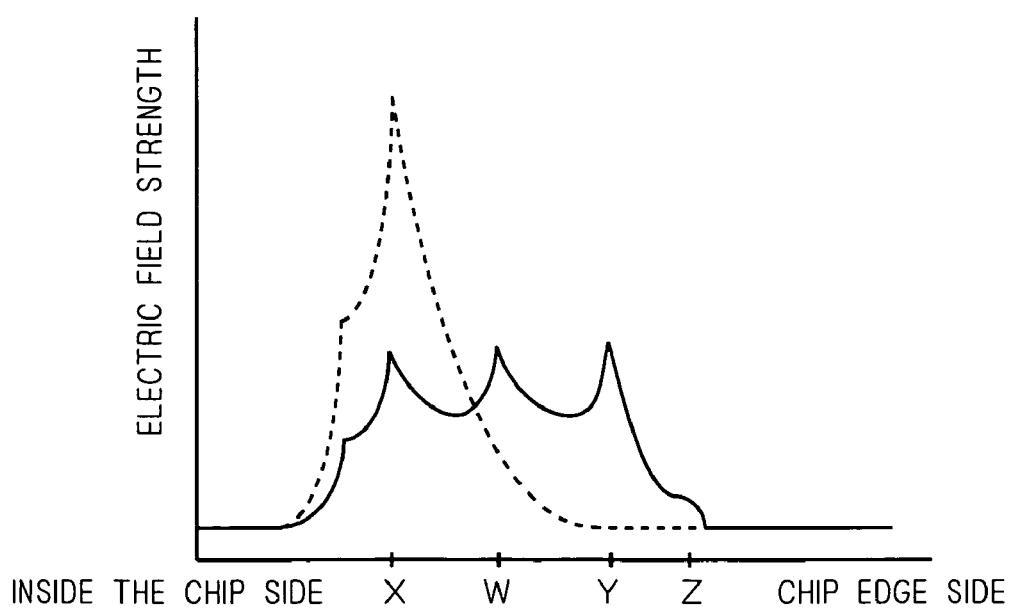
FIG. 9B illustrates electric field distribution on a chip peripheral portion of the semiconductor device.

FIG. 9B illustrates the action of the electrodes 20*a* and 20*b* in the FIG. 9A semiconductor device, showing electric field distribution on the silicon substrate surface in the chip peripheral portion when the IGBT is cut off and a voltage is applied such that the collector electrode 4 has a higher potential than the emitter electrode 10. The solid line graph represents the electric field distribution on the semiconductor device according to the third preferred embodiment as shown in FIG. 9A, whereas the dotted line graph represents the same in a conventional semiconductor device (one without the electrodes 20*a* and 20*b* in FIG. 9A), both of which are applied with the same voltage. Symbols W, X, Y, and Z shown in FIG. 9B correspond to the points W, X, Y, and Z as shown in FIG. 9A, respectively.

As shown in FIG. 9B, in the conventional semiconductor device without the electrodes 20*a* and 20*b*, an electric field peak (electric field concentration) appears at one point of the point X. On the other hand, in the semiconductor device according to the third preferred embodiment where a depletion layer extends easily due to the action of the electrodes 20*a* and 20*b*, electric field peaks appear at three points of the points W, X, and Y, each peak being smaller than the conventional one, and further smaller than those in the first preferred embodiment, as can be seen compared to the FIG. 1B graph. In short, the provision of the two intermediate potential electrodes 20*a* and 20*b* achieves a higher breakdown voltage of the semiconductor device than the first preferred embodiment.

Although not shown, a top view of the FIG. 9A semiconductor device is identical to those shown in FIGS. 3A and 3B except that there are two intermediate potential electrodes. Namely, the electrodes 20*a* and 20*b* are disposed in the chip peripheral portion to surround the cell region. Intermediate potential applying means for applying an intermediate potential to the electrodes 20a and 20b is the back-to-back diode 211 that is formed locally in a partial region on the chip peripheral portion, and connected between the emitter electrode 10 and the channel stopper electrode 12. The electrodes 20a and 20b are made of polysilicon independently drawn out from prescribed diodes within the back-to-back diode 211. The potentials at the electrodes 20a and 20b can be set arbitrarily by adjusting the positions in the back-to-back diode 211 from which the electrodes 20a and 20b are to be drawn out. The cross section of a region where the back-to-back diode 211 is formed in the chip peripheral portion is identical to that shown in FIG. 4.

Figure 10:
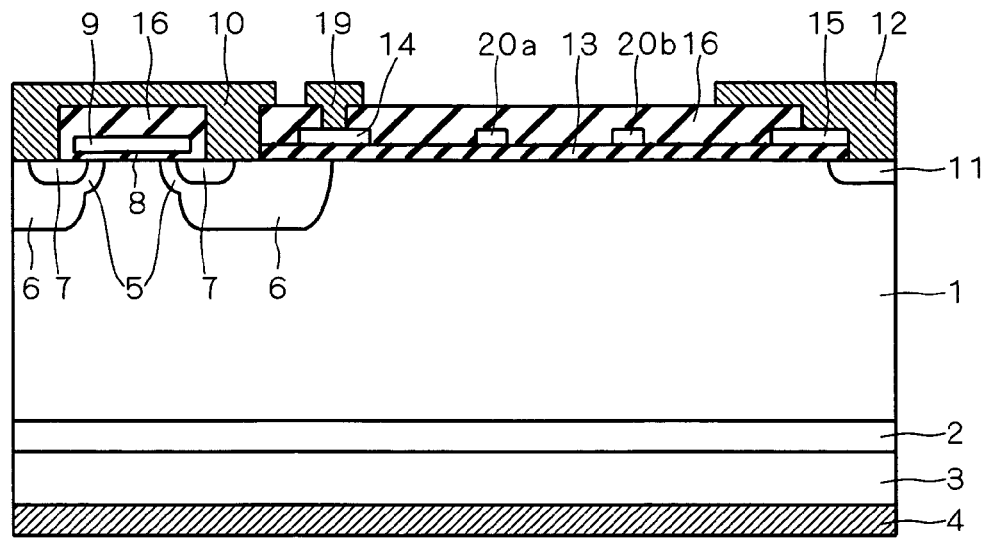
FIG. 10 illustrates the configuration of the semiconductor device according to the third preferred embodiment.

FIG. 10 illustrates the semiconductor device according to the second preferred embodiment including the two intermediate potential electrodes 20a and 20b. The other components in FIG. 10 are identical to those in FIG. 5 except that there are two intermediate potential electrodes, and detailed descriptions of FIG. 10 will thus be omitted.

Again in the FIG. 10 semiconductor device, there are provided the two intermediate potential electrodes 20a and 20b between the field plates 14 and 15 on the field oxide film 13, which are supplied with a lower potential than the silicon substrate surface therebelow, so that a depletion layer extends easily in the n⁻ drift layer 1 in the chip peripheral portion. This produces similar effects as those explained above with reference to FIG. 9B where breakdown hardly occurs in the chip peripheral portion, thereby achieving a high breakdown voltage of the semiconductor device.

Figure 11:
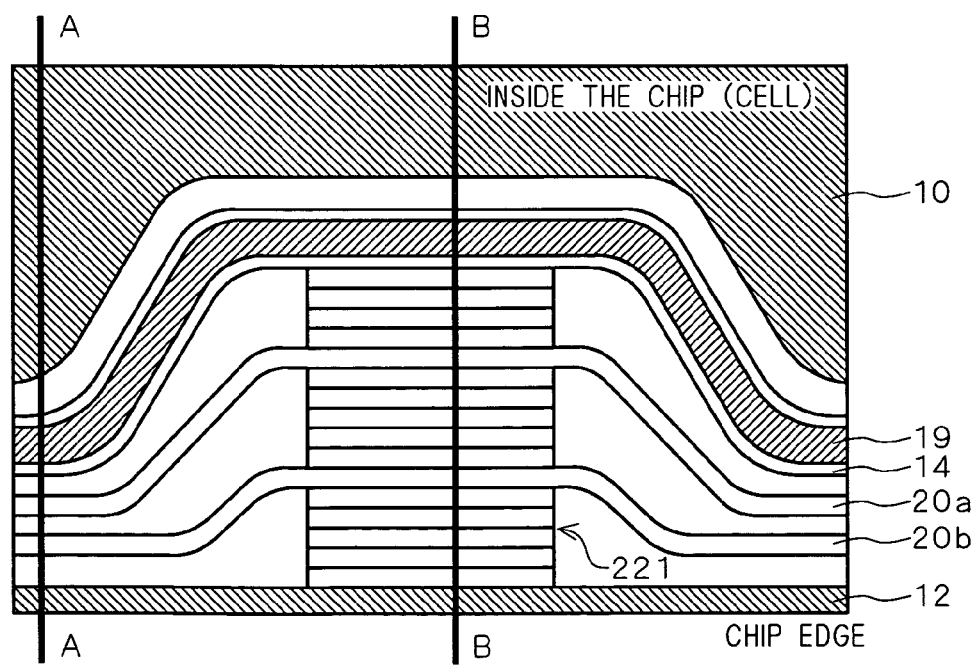
FIG. 11 is an enlarged top view of a portion where a back-to-back diode is formed in the semiconductor device according to the third preferred embodiment.

Although not shown, a top view of the FIG. 10 semiconductor device is identical to those shown in FIGS. 7A and 7B except that there are two intermediate potential electrodes. Namely, like the electrode 20 in the first preferred embodiment, the electrodes 20a and 20b are disposed in the chip peripheral portion to surround the cell region. Intermediate potential applying means for applying an intermediate potential to the electrodes 20a and 20b is the back-to-back diode 221 that is formed locally in a partial region on the chip peripheral portion, and connected between the gate wiring 19 and the channel stopper electrode 12. FIG. 11 is an enlarged view of a portion where the back-to-back diode 221 is formed. FIG. 10 is a cross-sectional view taken along the line A-A of FIG. 11, and FIG. 8 again along the line B-B.

As shown in FIG. 11, the electrodes 20a and 20b are made of polysilicon independently drawn out from prescribed diodes within the back-to-back diode 221. In short the electrodes 20a and 20b are independently connected to a diode of one prescribed stage among the back-to-back diode 221. The potentials at the electrodes 20a and 20b can be set arbitrarily by adjusting the positions in the back-to-back diode 221 from which the electrodes 20a and 20b are to be drawn out. Again in this structure, by setting the breakdown voltage of the back-to-back diode 221 to have a lower value than the breakdown voltage within the silicon substrate between the emitter electrode 10 and the channel stopper electrode 12, the so-called overvoltage protection capability that prevents an overvoltage from being applied between the collector and emitter is obtained.

As discussed above, the provision of a plurality of intermediate potential electrodes achieves a higher breakdown voltage of the semiconductor device. Influence by the mold polarization or an electric field outside the device is also highly suppressed, which achieves a more stabilized breakdown voltage of the semiconductor device. Moreover, because the intermediate potential applying means is only formed partially on the chip peripheral portion, the width of the remaining potion on the chip peripheral portion can be reduced. And because a high breakdown voltage is achieved due to the action of the intermediate potential electrodes, deterioration of the breakdown voltage can be suppressed even with the width reduction of the chip peripheral portion. In short, this invention helps achieve a high degree of integration and size reduction of the semiconductor device while maintaining the breakdown voltage.

While the plurality of electrodes 20a and 20b are both independently supplied with a lower potential than the silicon substrate surface therebelow in the above example, the effect of facilitating extension of a depletion layer is obtained by setting at least one (particularly the nearest one to the low voltage side) of a plurality of intermediate potential electrodes to have a lower potential than the semiconductor substrate surface immediately therebelow.

Again in the third preferred embodiment where a plurality of intermediate potential electrodes are provided, the electrodes should be disposed near the field plate 14 side, to facilitate extension of a depletion layer effectively. That is, assuming that the distance between the field plates 14 and 15 is "L", it is desirable that the distance between the nearest intermediate potential electrode to the field plate 14 side and the field plate 14 be smaller than "L/(N−1)".

While there are provided the two electrodes 20a and 20b as intermediate potential electrode in the above description, the number of the electrodes may be increased as necessary. Similar effects will be obtained in such cases as well.

Fourth Preferred Embodiment

Figure 12:
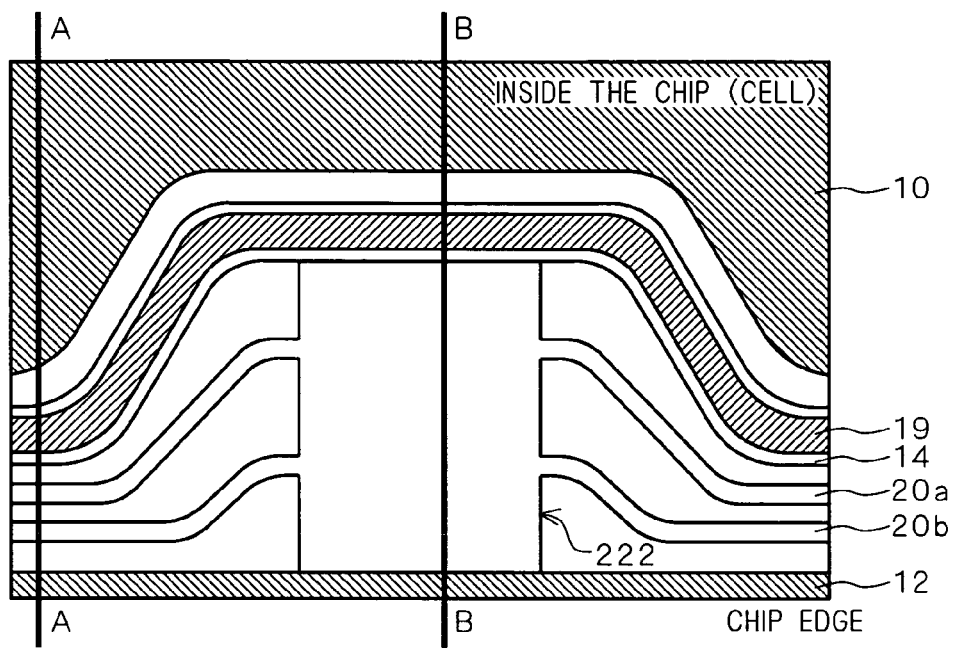
FIG. 12 is an enlarged top view of a portion where a back-to-back diode is formed in a semiconductor device according to a fourth preferred embodiment.
Figure 13:
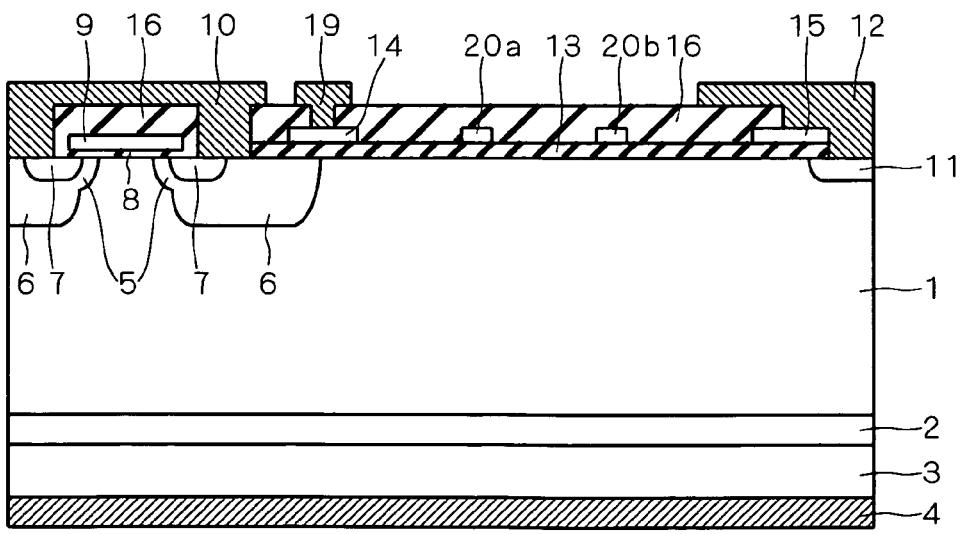
FIGS. 13 and 14 illustrate the configuration of the semiconductor device according to the fourth preferred embodiment.
Figure 14:
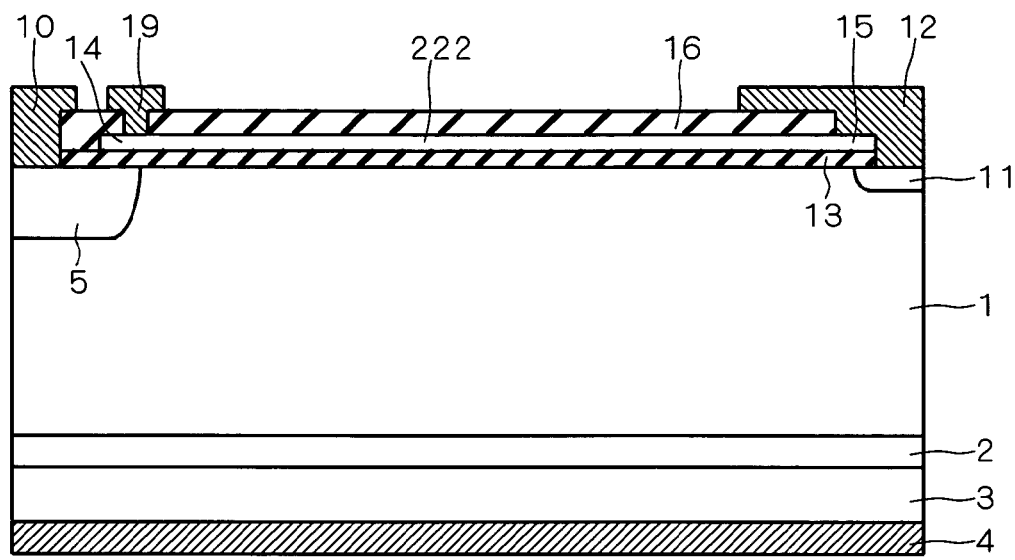

There is illustrated another example of the intermediate potential applying means in a fourth preferred embodiment of this invention. FIG. 12 illustrates a semiconductor device according to the fourth preferred embodiment, which is an enlarged view of a portion where the intermediate potential applying means is formed on the chip peripheral portion. A resistance element 222 is adopted instead of the back-to-back diode 221 as the intermediate potential applying means 22 in the semiconductor device according to the third preferred embodiment. In FIG. 12, elements identical to those in FIG. 11 are denoted by like reference numbers and designations. The resistance element 222 is made of polysilicon, formed locally in a partial region on the chip peripheral portion, and connected between the gate wiring 19 and the channel stopper electrode 12. FIGS. 13 and 14 are cross-sectional views taken along the lines A-A and B-B of FIG. 12, respectively. As can be seen from FIGS. 12 to 14, the only difference from the third preferred embodiment lies in the resistance element 222 replacing the back-to-back diode 221.

The voltage between the gate wiring 19 and the channel stopper electrode 12 is held by the resistance element 222, and as shown in FIG. 12, the electrodes 20a and 20b are made of polysilicon independently drawn out from part of the resistance element 222. In short, the electrodes 20a and 20b are independently connected to part of the resistance element 222, and applied with the voltage between the gate wiring 19 and the channel stopper electrode 12 that is divided with a prescribed ratio. Namely, the resistance element 222 functions as voltage dividing means. With the potential changing almost linearly between the gate wiring 19 and the channel stopper electrode 12 inside the resistance element 222, the potentials at the electrodes 20a and 20b can be set arbitrarily by adjusting the positions in the resistance element 222 from which the electrodes 20a and 20b are to be drawn out.

The fourth preferred embodiment produces similar effects by the electrodes 20a and 20b as in the third preferred embodiment, and descriptions thereof will thus be omitted.

While the resistance element 222 is connected between the gate wiring 19 and the channel stopper electrode 12 and has the so-called overvoltage protection capability in this embodiment, a resistance element as intermediate potential applying means may alternatively be connected between the emitter electrode 10 and the channel stopper electrode 12, as in the first preferred embodiment. Similar effects will be obtained in such case as well.

Fifth Preferred Embodiment

Figure 15:
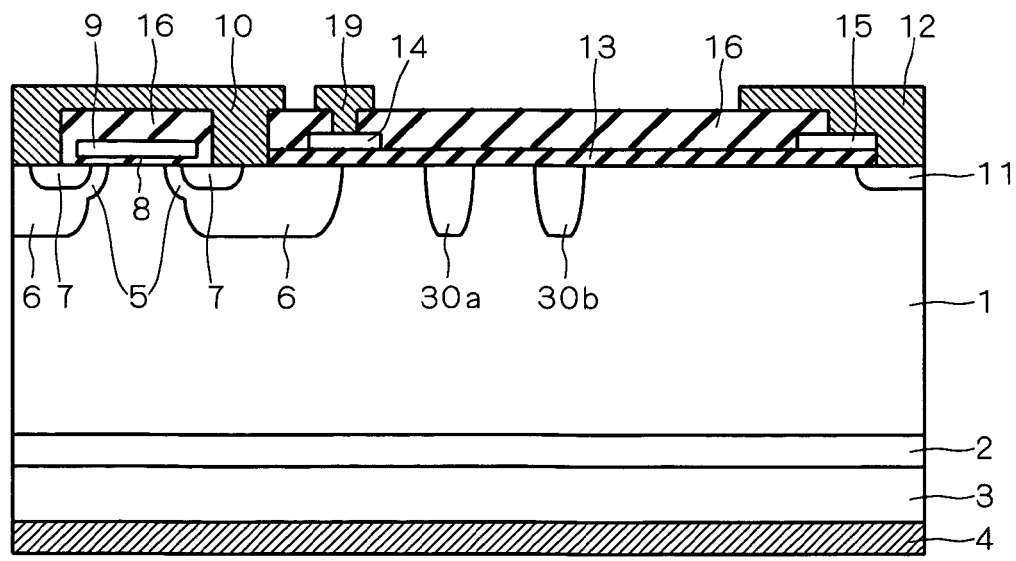
FIG. 15 illustrates the configuration of a semiconductor device according to a fifth preferred embodiment.

FIG. 15 illustrates the configuration of a semiconductor device according to a fifth preferred embodiment of this invention, which is a peripheral portion of a vertical IGBT chip. In FIG. 15, elements identical to those in FIG. 5 are denoted by like reference numbers, and detailed descriptions thereof will thus be omitted.

In the chip peripheral portion on the right side portion of FIG. 15, p-type guard rings 30a and 30b are provided in the n⁻ drift layer 1 below the field oxide film 13. The provision of these guard rings facilitates extension of a depletion layer in the n⁻ drift layer 1 in the chip peripheral portion, thereby achieving a high breakdown voltage.

FIG. 16A is a top view of the chip of the semiconductor device according to the fifth preferred embodiment. In FIG. 16A, elements identical to those in FIG. 15 are denoted by like reference numbers. As shown in FIG. 16A, the guard rings 30a and 30b are disposed in the chip peripheral portion to surround the cell region. And a multistage back-to-back diode connected between the gate wiring 19 and the channel stopper electrode 12 and including a plurality of diodes in series that are connected back-to-back is formed locally in a partial region on the chip peripheral portion (this multistage back-to-back diode is hereinafter collectively referred to as a "back-to-back diode 31"). Because the back-to-back diode 31 is formed locally in a partial region on the chip peripheral portion, the width of the remaining region on the chip peripheral portion can be reduced. The breakdown voltage can be maintained due to the action of the guard rings 30a and 30b even with the width reduction of the chip peripheral portion.

Conversely, however, the width of the region on the chip peripheral portion where the back-to-back diode 31 is formed is sometimes required to be wider than the remaining region. Furthermore, the position and potential of each of the guard rings 30a and 30b need to be set such that a prescribed breakdown voltage is obtained. At this time, the potentials at the guard rings 30a and 30b independently need to match the potential at the back-to-back diode 31 positioned thereabove.

FIG. 16B is an enlarged view of a portion where the back-to-back diode 31 is formed in FIG. 16A. The back-to-back diode 31 is formed by alternately disposing p-type region and n-type region on polysilicon formed on the field oxide film 13. Below and in the vicinity of the portion where the back-to-back diode 31 is formed, a p-type impurity region 32 is formed locally, the region 32 being of line shape that does not intersect but is almost parallel with the guard rings 30a and 30b, and of the same conductivity type as the guard rings 30a and 30b. In short, the p-type impurity region 32 crosses below the back-to-back diode 31, and is not ring-shaped as the guard rings 30a and 30b but line-shaped with a finite length. The above FIG. 15 is a cross-sectional view taken along the line A-A of FIG. 16B, and FIGS. 17 and 18 along the lines B-B and C-C, respectively. Again in FIGS. 17 and 18, elements identical to those in FIGS. 15 and 16B are denoted by like reference numbers.

Because the width of the region on the chip peripheral portion where the back-to-back diode 31 is formed is wider than the remaining region, in order to match the potentials at the guard rings 30a and 30b independently to the potential at the back-to-back diode 31 positioned thereabove, the distance between the guard rings 30a and 30b needs to be widened in the region where the back-to-back diode 31 is formed, as shown in FIG. 16B. At this time, without the p-type impurity region 32, a depletion layer does not extend sufficiently in the region (FIG. 18) in the vicinity of the back-to-back diode 31 where the distance between the guard rings 30a and 30b is widened, which generates electric field concentration. Therefore, in the fifth preferred embodiment, the line-shaped p-type impurity region 32 is provided between the guard rings 30a and 30b in the region in the vicinity of the back-to-back diode 31 where the distance between the guard rings 30a and 30b is widened, so that a depletion layer extends easily in that region. This relieves electric field concentration in the vicinity of the back-to-back diode 31, thereby achieving a high breakdown voltage in the chip peripheral portion.

In the region (FIG. 17) immediately below the back-to-back diode 31, the diode 31 functions as a field plate. Accordingly, a depletion layer extends relatively easily in this region even with the wide distance between the guard rings 30a and 30b, which suppresses the occurrence of electric field concentration. Nevertheless, the provision of the p-type impurity region 32 immediately below the back-to-back diode 31 as well, as in the fifth preferred embodiment, stabilizes the potential at the p-type impurity region 32, thereby achieving a more stabilized breakdown voltage.

The p-type impurity region 32 according to the fifth preferred embodiment can be formed in the step of forming a guard ring in a method of forming a conventional semiconductor device, by changing its pattern shape. The back-to-back diode 31 can too be formed in the step of forming a back-to-back diode in the method of forming a conventional semiconductor device, by changing its pattern shape. In short, there is no increase in the number of steps included in the method of manufacturing a conventional semiconductor device.

The above description of providing the single p-type impurity region 32 between the two guard rings 30a and 30b should be considered as an exemplar, rather than as limitations on this invention. The number and positions of the guard rings and p-type impurity region may be changed as necessary, which will be discussed below.

Figure 18:
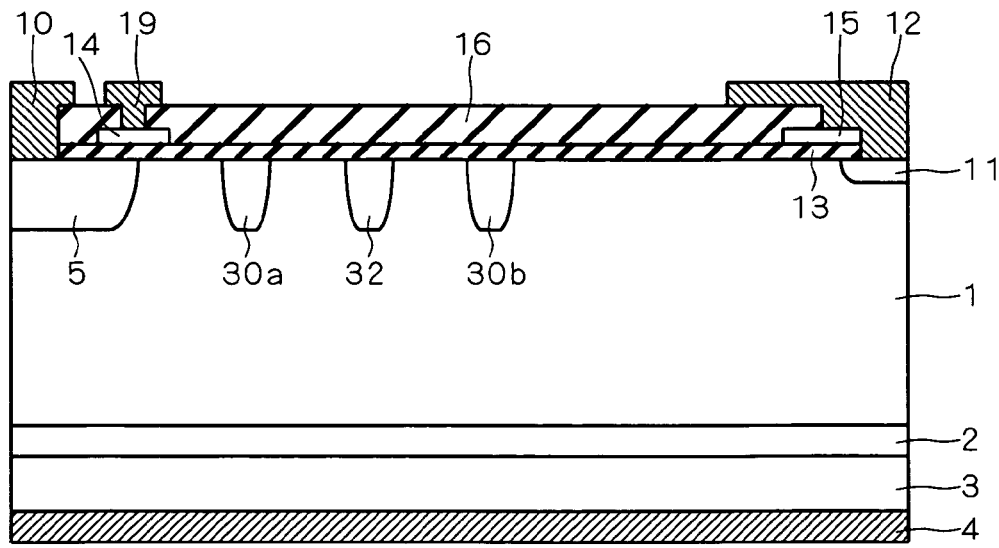
Figure 19:
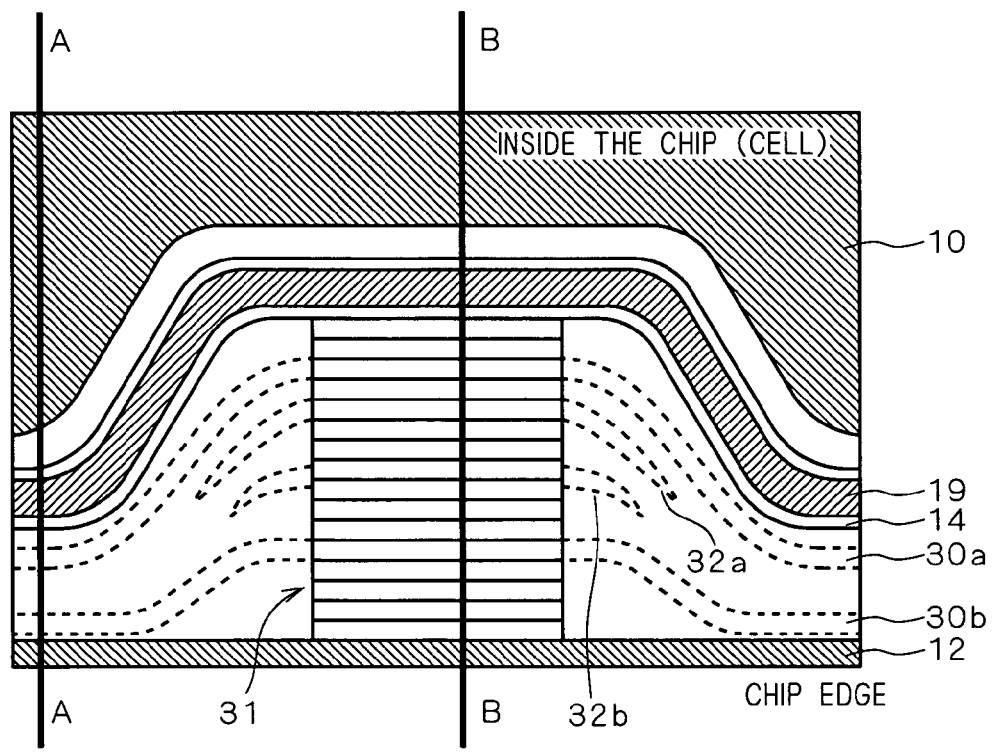
FIG. 19 is an enlarged top view of a portion where a back-to-back diode is formed in the semiconductor device according to the fifth preferred embodiment.
Figure 20:
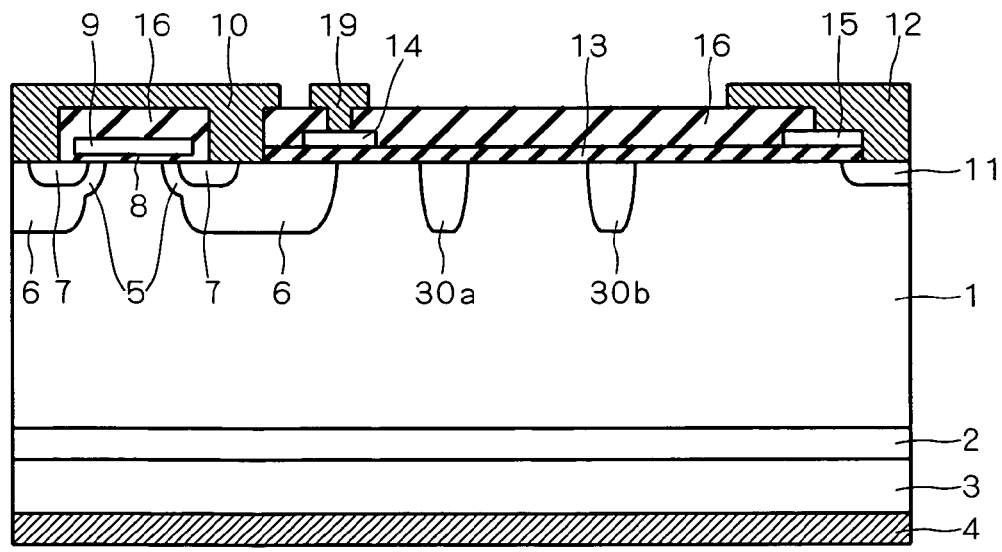
FIGS. 20 to 22 illustrate the configuration of the semiconductor device according to the fifth preferred embodiment.
Figure 21:
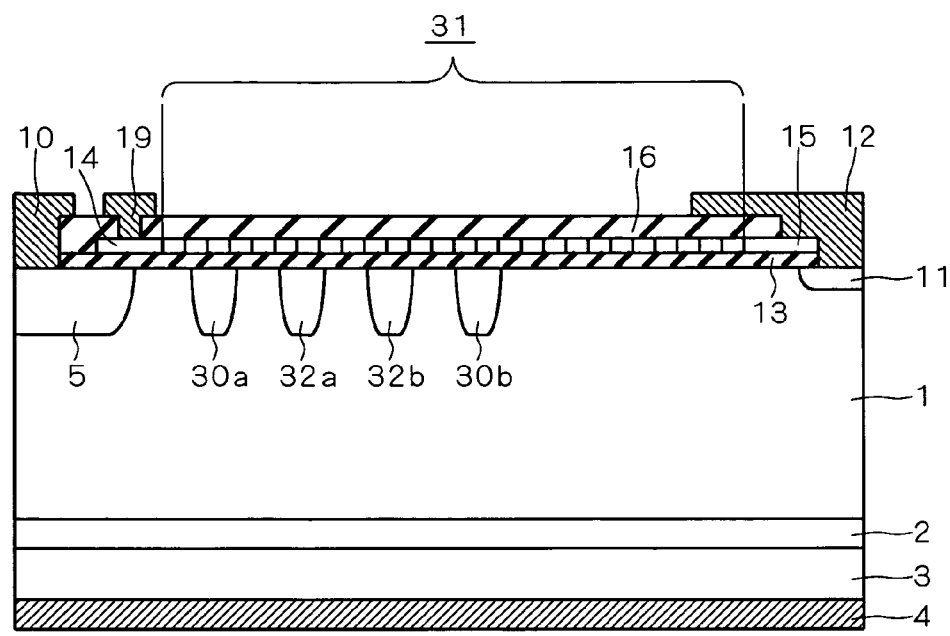

For instance, FIGS. 19 to 21 illustrate an example where two p-type impurity regions 32a and 32b are disposed between the guard rings 30a and 30b. FIG. 19 is an enlarged view of a portion where the back-to-back diode 31 is formed on the chip peripheral portion, and FIGS. 20 and 21 are cross-sectional views taken along the lines A-A and B-B of FIG. 19, respectively. In FIGS. 19 to 21, elements identical to those in FIGS. 15 to 18 are denoted by like reference numbers and designations. The p-type impurity regions 32a and 32b are independently of line shape that does not intersect but is almost parallel with the guard rings 30a and 30b, and formed locally below and in the vicinity of the back-to-back diode 31. A plurality of p-type impurity regions should be provided between the guard rings in this fashion, when the distance between the guard rings in the vicinity of the back-to-back diode 31 is particularly widened by widening the forming region width of the back-to-back diode 31 on the chip peripheral portion, or by reducing the number of guard rings.

Figure 22:
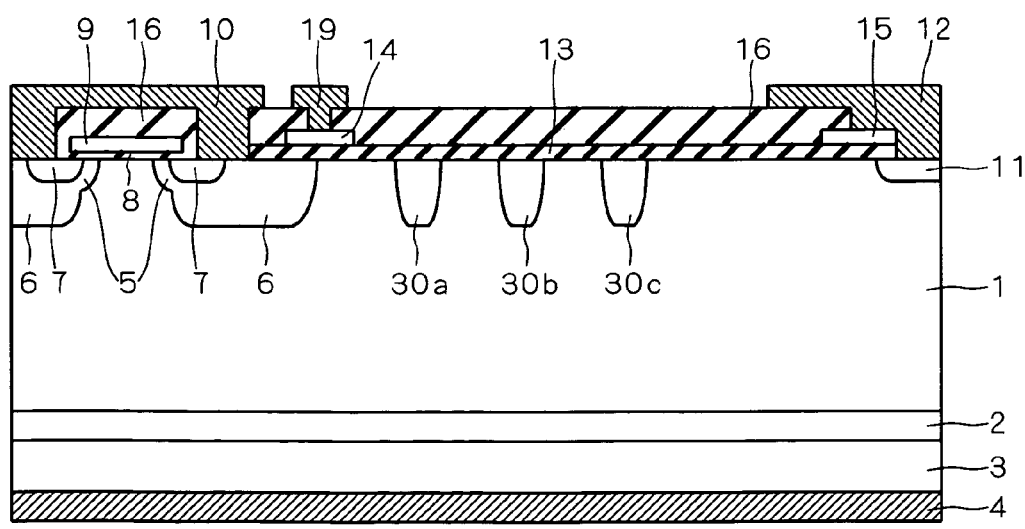
Figure 23:
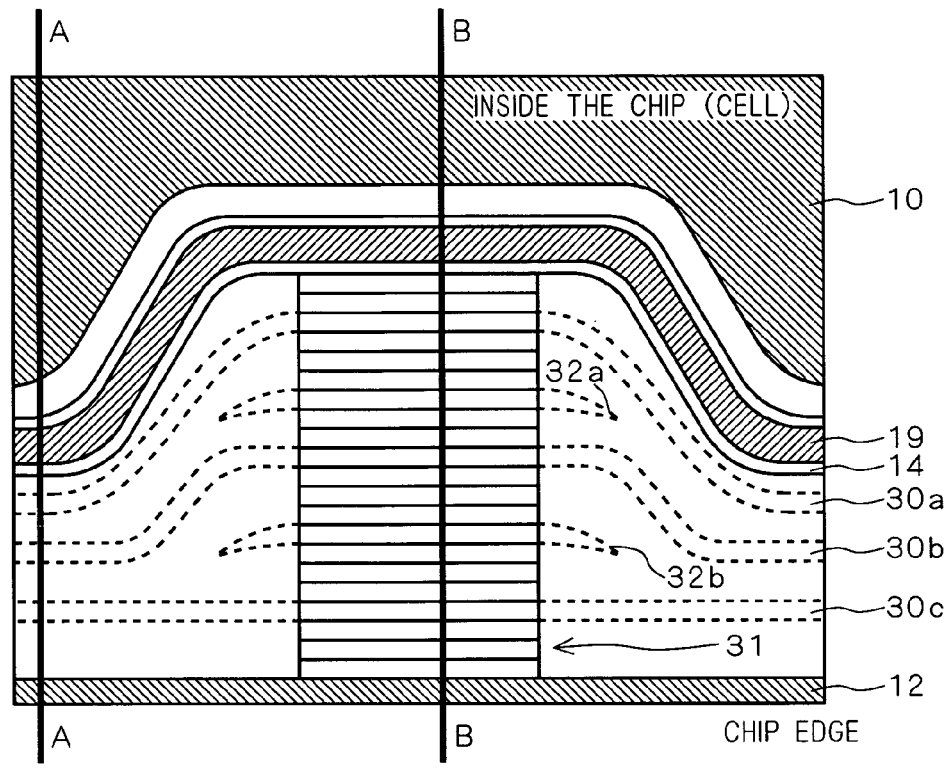
FIG. 23 is an enlarged top view of a portion where a back-to-back diode is formed in the semiconductor device according to the fifth preferred embodiment.
Figure 24:
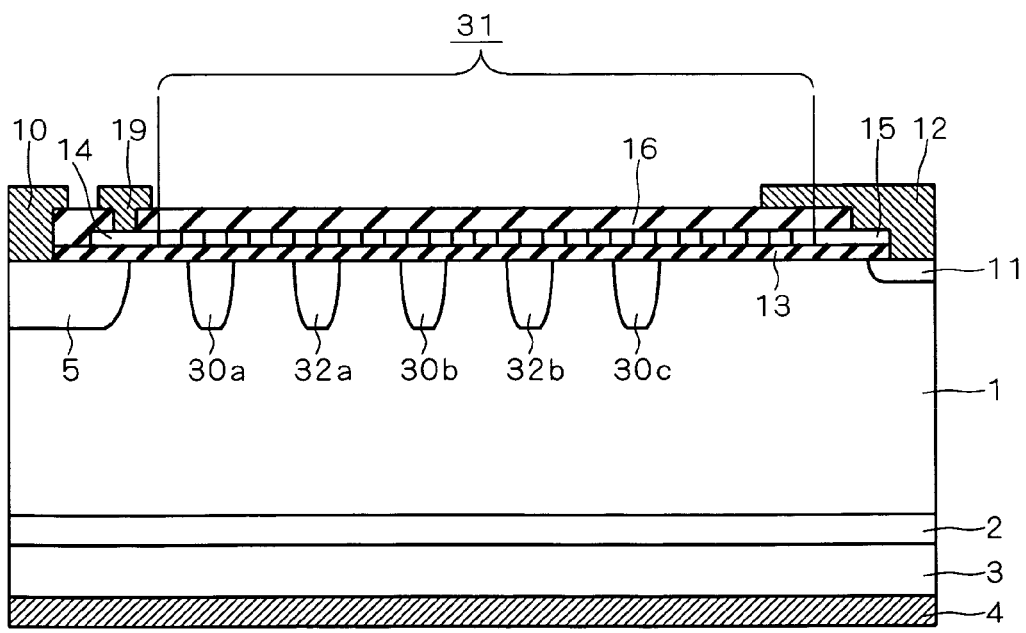
FIG. 24 illustrates the configuration of the semiconductor device according to the fifth preferred embodiment.

Further for instance, FIGS. 22 to 24 illustrate an example where three guard rings 30a, 30b, and 30c are provided. FIG. 23 is an enlarged view of a portion where the back-to-back diode 31 is formed on the chip peripheral portion, and FIGS. 22 and 24 are cross-sectional views taken along the lines A-A and B-B of FIG. 23, respectively. Again in FIGS. 22 to 24, elements identical to those in FIGS. 15 to 18 are denoted by like reference numbers and designations. The p-type impurity region 32a is provided between the guard rings 30a and 30b, and the p-type impurity region 32b between the guard rings 30b and 30c. The p-type impurity regions 32a and 32b are independently of line shape that is almost parallel with the guard rings 30a, 30b, and 30c, and formed locally below and in the vicinity of the back-to-back diode 31. In increasing the number of guard rings, a p-type impurity region should be provided between each guard ring in this fashion, to facilitate extension of a depletion layer between each guard ring thus suppressing the occurrence of electric field concentration.

Figure 17:
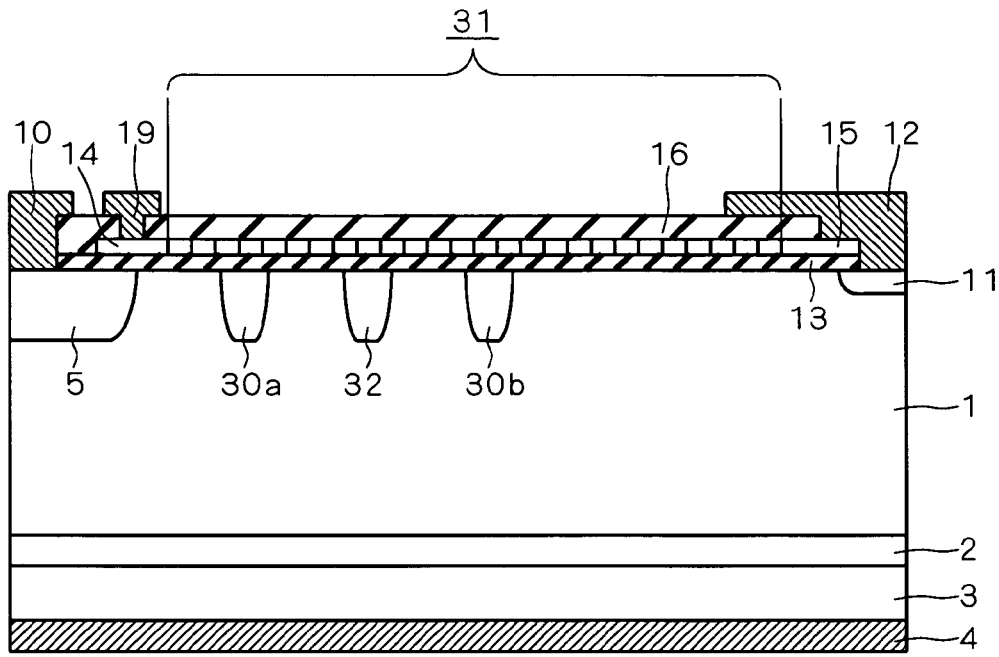
FIGS. 17 and 18 illustrate the configuration of the semiconductor device according to the fifth preferred embodiment.

While a line-shaped p-type impurity region is provided between guard rings in the above example, a line-shaped p-type impurity region that is almost parallel with the guard rings may alternatively be formed between the p base region 5 and the guard ring 30a, or between the channel stopper layer 11 and the guard ring 30b in FIG. 17.

Moreover, the fifth preferred embodiment in which the p-type impurity region 32 is provided locally in the region where the back-to-back diode 31 is formed, will also be applicable when a resistance element (which is made of polysilicon such as is shown in FIG. 12) is used instead of the back-to-back diode 31. In that case too, the positions of the guard rings should be determined to match potential distribution within the resistance element, and a line-shaped p-type impurity region should be formed in a portion where the distance between the guard rings is widened.

Sixth Preferred Embodiment

Figure 25:
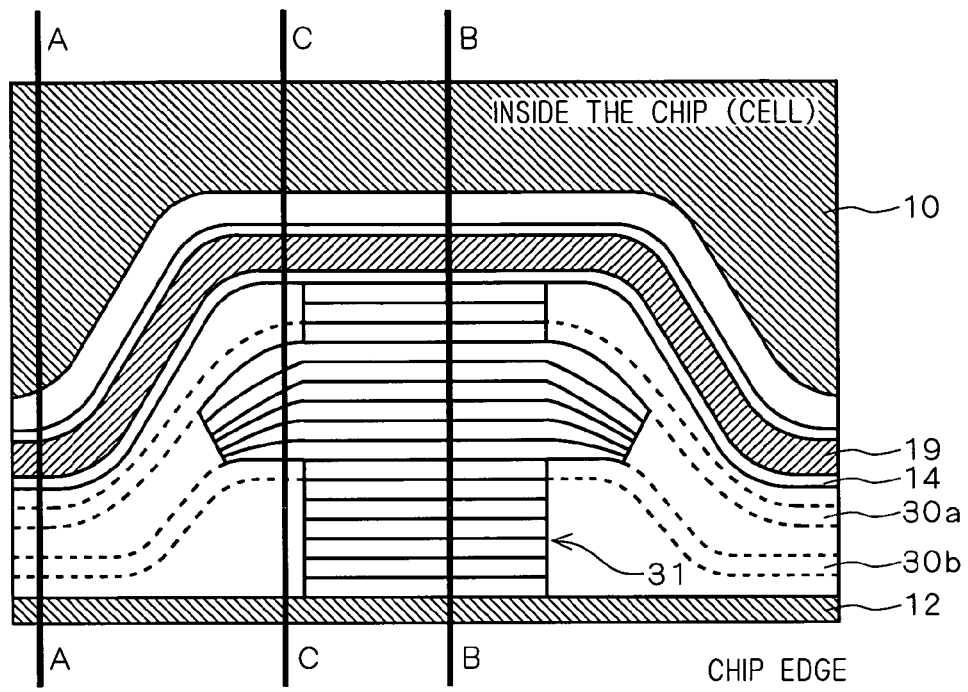
FIG. 25 is an enlarged top view of a portion where a back-to-back diode is formed in a semiconductor device according to a sixth preferred embodiment.
Figure 26:
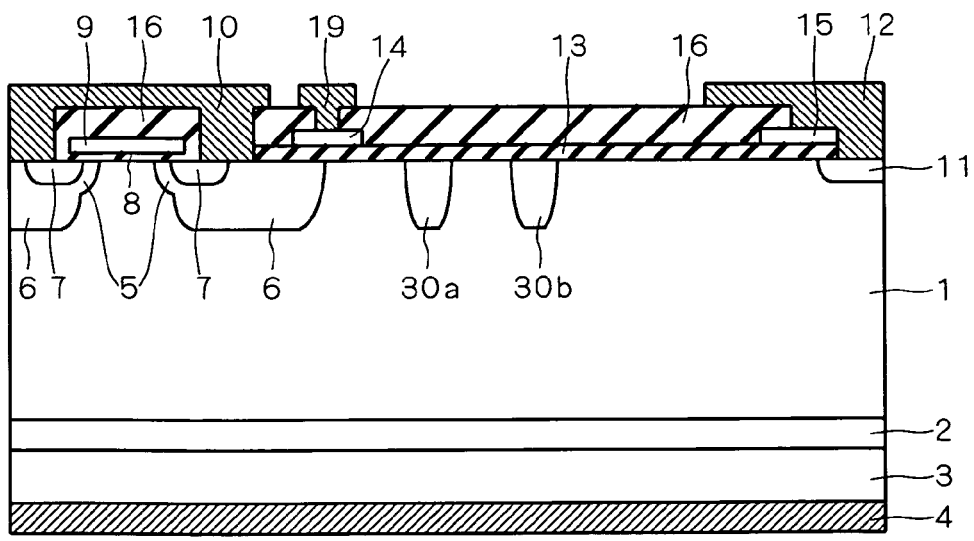
FIGS. 26 to 28 illustrate the configuration of the semiconductor device according to the sixth preferred embodiment.
Figure 27:
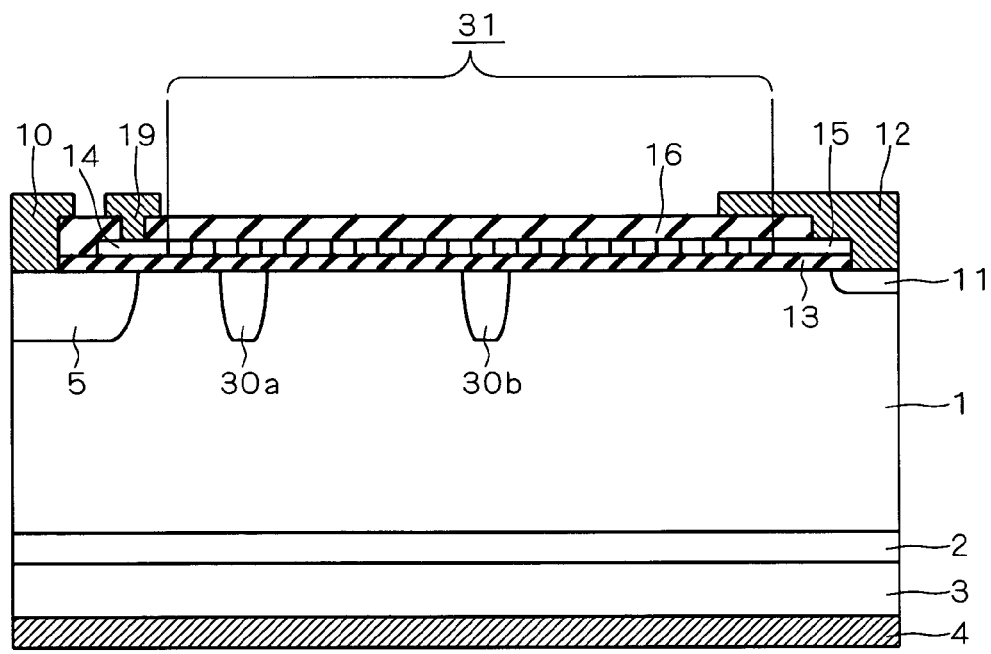
Figure 28:
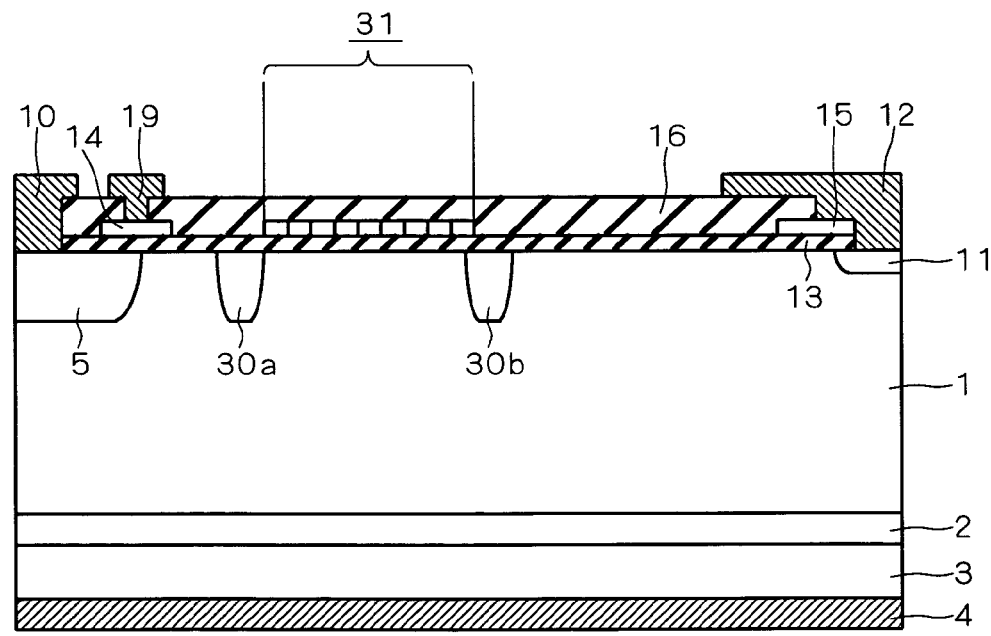

FIG. 25 illustrates the configuration of a semiconductor device according to a sixth preferred embodiment of this invention, which is an enlarged view of a portion where the back-to-back diode 31 is formed on a peripheral portion of a vertical IGBT chip. FIGS. 26, 27, and 28 are cross-sectional views taken along the lines A-A, B-B, and C-C of FIG. 25, respectively. In FIGS. 25 to 28, elements identical to those in FIGS. 16 to 18 are denoted by like reference numbers and designations.

The guard rings 30a and 30b are disposed in the chip peripheral portion to surround the cell region. And the multistage back-to-back diode 31 connected between the gate wiring 19 and the channel stopper electrode 12 and including a plurality of diodes in series that are connected back-to-back is provided locally in a partial region on the chip peripheral portion. Because the back-to-back diode 31 is formed locally in a partial region on the chip peripheral portion, the width of the remaining region on the chip peripheral portion can be reduced, which helps achieve a high degree of integration and size reduction of the semiconductor device.

However, as discussed in the fifth preferred embodiment as well, the width of the region on the chip peripheral portion where the back-to-back diode 31 is formed is sometimes required to be wider than the remaining region. And in order to match the potentials at the guard rings 30a and 30b independently to the potential at the back-to-back diode 31 positioned thereabove, the distance between the guard rings 30a and 30b needs to be widened in the region where the back-to-back diode 31 is formed, as shown in FIG. 25.

In the sixth preferred embodiment, the back-to-back diode 31 is widened in a portion where the distance between the guard rings 30a and 30b is widened. That is, as shown in FIG. 25, diodes within the back-to-back diode 31 that are positioned above a portion between the guard rings 30a and 30b are widened to project in the width direction. Each of the widened diodes within the back-to-back diode 31 is of line shape that does not intersect but is almost parallel with the guard rings in plan view, as shown in FIG. 25.

Although the widening of the distance between the guard rings, as shown in FIGS. 27 and 28, generally suppresses sufficient extension of a depletion layer and facilitates the occurrence of electric field concentration in that portion, in the region immediately below the back-to-back diode 31 as shown in FIG. 27, the diode 31 functions as a field plate so that a depletion layer extends relatively easily and the occurrence of electric field concentration is suppressed even with the wide distance between the guard rings 30a and 30b. Also in the region as shown in FIG. 28, the widened portion of the back-to-back diode 31 functions as a field plate between the guard rings 30a and 30b so that the occurrence of electric field concentration is suppressed. Moreover, since the potentials at the guard rings 30a and 30b match potential distribution of the back-to-back diode 31, and each of the widened diodes within the back-to-back diode 31 is of line shape that is almost parallel with the guard rings in plan view, the potential at each diode becomes nearly equal to the substrate surface therebelow, thereby achieving an appropriate potential distribution as a field plate.

Figure 29A:
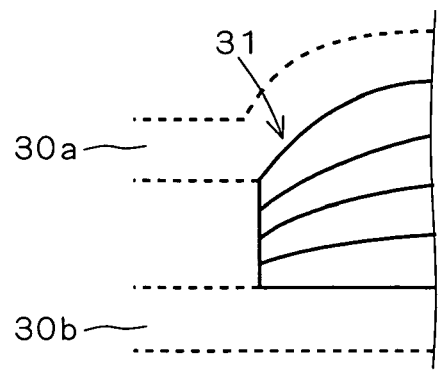
FIGS. 29A and 29B explain the shape of the back-to-back diode according to the sixth preferred embodiment.
Figure 29B:
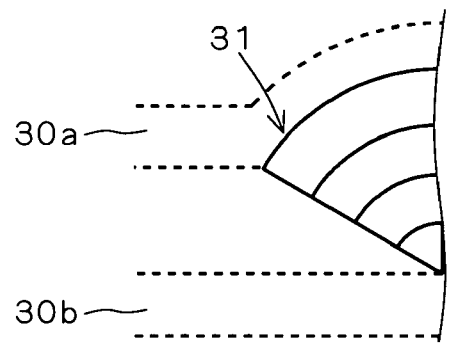

FIGS. 29A and 29B illustrate examples of a shape of the widened portion of the back-to-back diode 31 which is projecting in the width direction. This portion should be taper-shaped to fit the shape of a region between the guard rings 30a and 30b, as shown in FIG. 29A. Alternatively, the portion may be fan-shaped to fit the shape of the guard ring 30a, as shown in FIG. 29B. In either case, each diode is disposed almost in parallel with the guard rings in plan view, thereby achieving an appropriate potential distribution as a field plate.

The back-to-back diode 31 according to the sixth preferred embodiment can be formed in the step of forming a back-to-back diode in a method of forming a conventional semiconductor device, by changing its pattern shape. In short, there is no increase in the number of steps included in the method of manufacturing a conventional semiconductor device.

Seventh Preferred Embodiment

Figure 30:
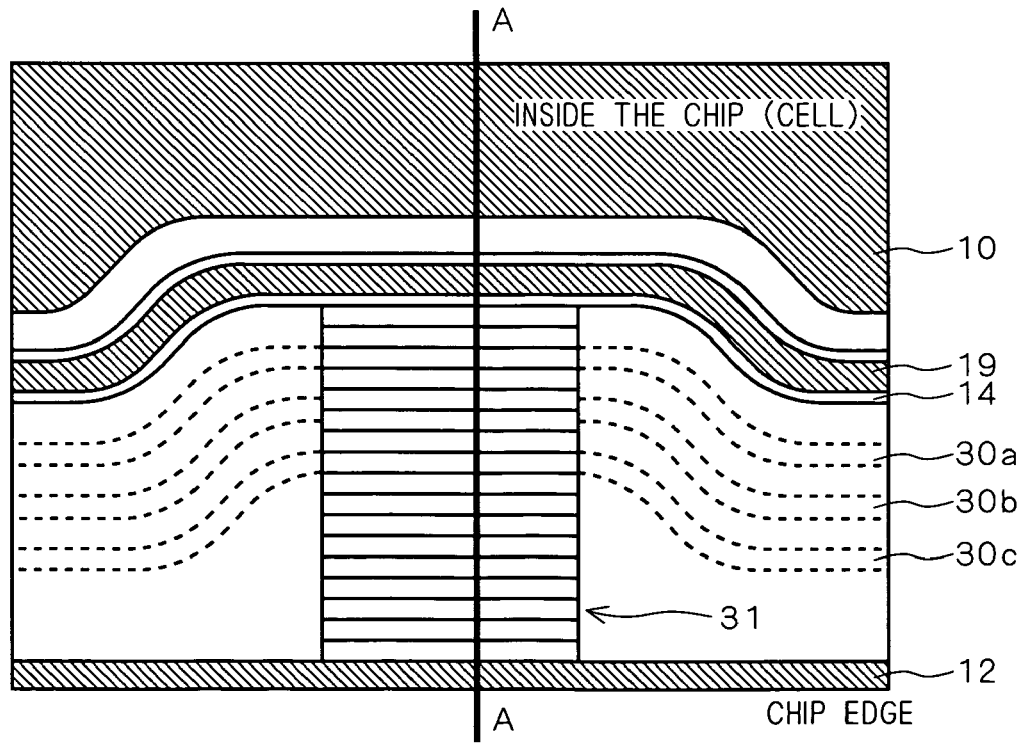
FIG. 30 is an enlarged top view of a portion where a back-to-back diode is formed in a semiconductor device according to a seventh preferred embodiment.

In a seventh preferred embodiment of this invention, the width of the guard ring below the back-to-back diode on the chip peripheral portion is optimized. FIG. 30 is an enlarged view of a portion where the back-to-back diode 31 is formed on a peripheral portion of a vertical IGBT chip. The three guard rings 30a, 30b, and 30c are disposed in the chip peripheral portion to surround the cell region. And the multistage back-to-back diode 31 connected between the gate wiring 19 and the channel stopper electrode 12 and including a plurality of diodes in series that are connected back-to-back is provided locally in a partial region on the chip peripheral portion.

Figure 31A:
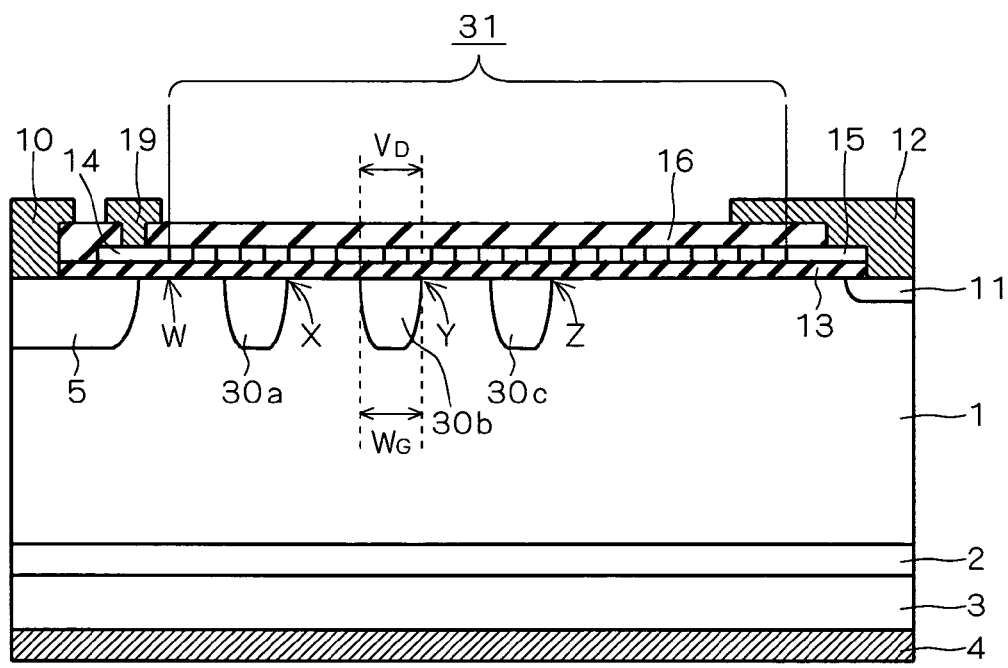
FIG. 31A illustrates the configuration of the semiconductor device according to the seventh preferred embodiment.
Figure 31B:
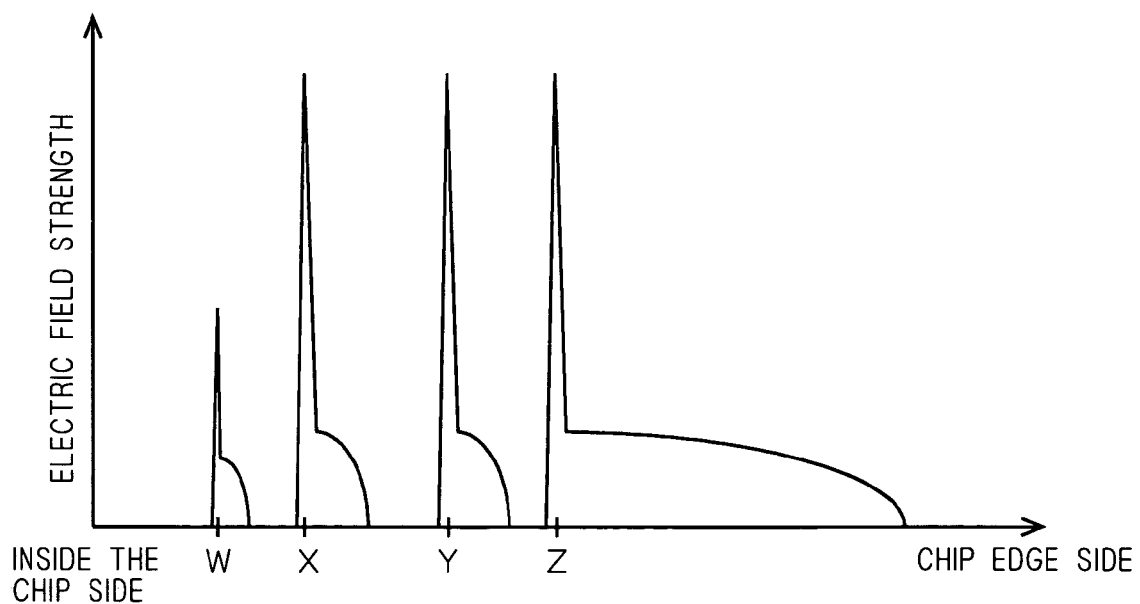
FIG. 31B illustrates electric field distribution on a chip peripheral portion of the semiconductor device.

FIGS. 31A and B explain the seventh preferred embodiment. FIG. 31A is a cross-sectional view taken along the line A-A of FIG. 30, and FIG. 31B shows electric field distribution on the silicon substrate surface of the cross section. Symbols W, X, Y, and Z shown in FIG. 31B correspond to points W (high voltage side edge portion of the field plate 14), X (high voltage side edge portion of the guard ring 30a), Y (high voltage side edge portion of the guard ring 30b), and Z (high voltage side edge portion of the guard ring 30c) as shown in FIG. 31A, respectively. When the distances between the guard rings 30a, 30b, and 30c are wide as shown in FIG. 31A, great electric field peaks (electric field concentrations) appear at the points X, Y, and Z as shown in FIG. 31B.

The guard rings 30a, 30b, and 30c, which have a low resistance value, each have a nearly uniform potential inside.

Namely, potential variations are almost nonexistent across a width $W_G$ of each of the guard rings 30a, 30b, and 30c. On the other hand, in the back-to-back diode 31, which shares and holds the voltage between the gate wiring 19 and the channel stopper electrode 12 by each individual diode therein, a potential difference $V_D$ develops across the width $W_G$. The wider the width $W_G$ as shown in FIG. 31A the bigger the potential difference $V_D$, whereby the guard rings 30a, 30b, and 30c each match the back-to-back diode 31 in potential on its low voltage side, whereas do not match on its high voltage side. As a result, great electric field peaks (electric field concentrations) appear at the points X, Y, and Z, as shown in FIG. 31B.

Figure 32A:
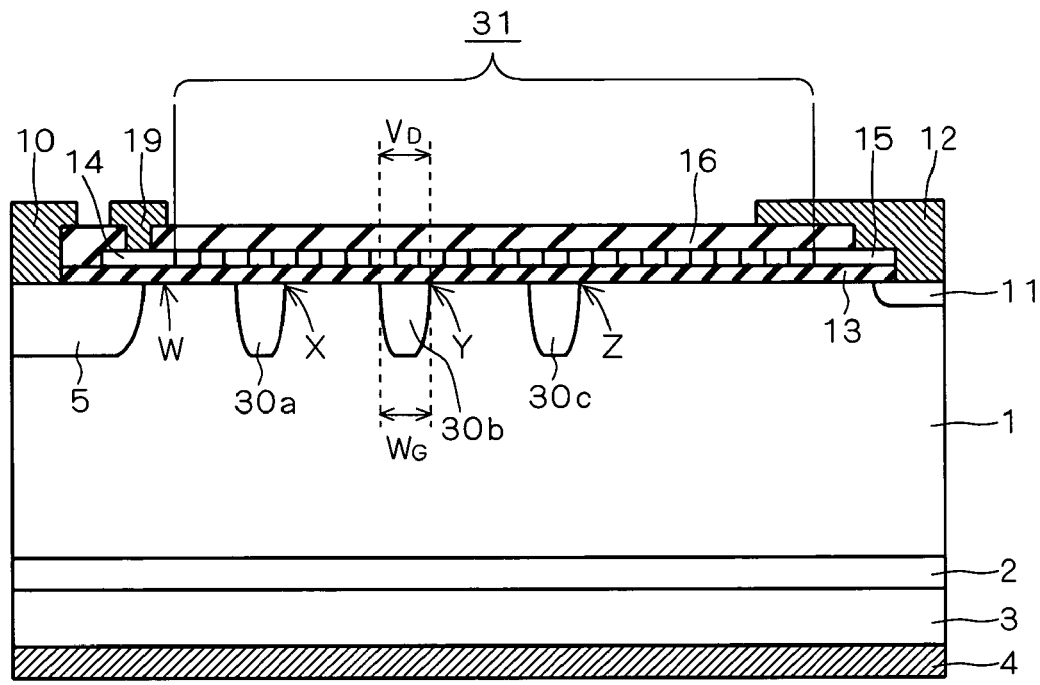
FIG. 32A illustrates the configuration of the semiconductor device according to the seventh preferred embodiment.
Figure 32B:
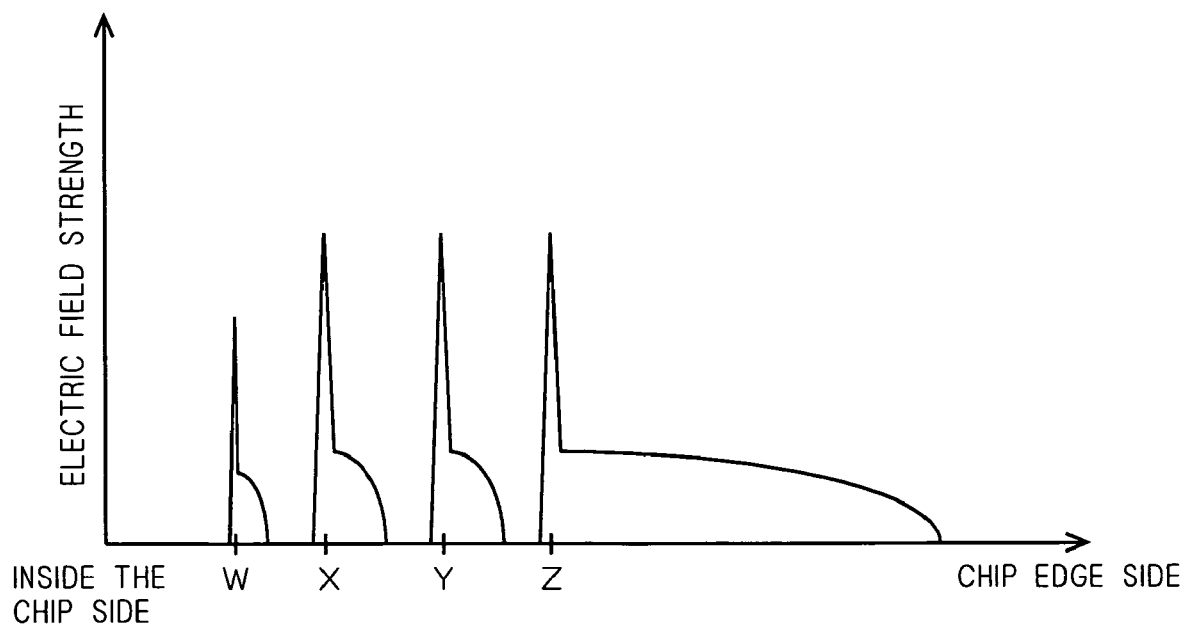
FIG. 32B illustrates electric field distribution on the chip peripheral portion of the semiconductor device.

Therefore, in the seventh preferred embodiment, the width $W_G$ of each of the guard rings 30a, 30b, and 30c is reduced below the back-to-back diode 31. The reduction of the width $W_G$ in turn reduces the potential difference $V_D$ across that width in the back-to-back diode 31, which relieves a potential difference between each of the guard rings 30a, 30b, and 30c and the back-to-back diode 31 on its high voltage side. As a result, the electric field peaks at the points X, Y, and Z become smaller as shown in FIG. 32B, thereby achieving a high breakdown voltage in the chip peripheral portion.

The inventor of this invention performed a breakdown voltage simulation of a semiconductor device on conditions of a breakdown voltage of approximately 400 to 800 V, a field oxide film of approximately 1.0 μm, and approximately two to six guard rings, and obtained a result that indicates extreme deterioration of the breakdown voltage after the potential difference $V_D$ exceeds 60 V. Namely, the width $W_G$ should be set such that the potential difference $V_D$ does not exceed 60V even when the voltage between the gate wiring 19 and the channel stopper electrode 12 (≈voltage between the emitter and collector) reaches a maximum value. In the semiconductor device according to the seventh preferred embodiment that has the overvoltage protection capability by the back-to-back diode 31, the maximum value of the voltage between the gate wiring 19 and the channel stopper electrode 12 is equivalent to the breakdown voltage of the back-to-back diode 31. That is, the guard ring width $W_G$ should be set such that the voltage $V_D$ held by diodes positioned above each guard ring is 60 V or below with the breakdown voltage of the back-to-back diode 31 being applied between the gate wiring 19 and the channel stopper electrode 12, thereby suppressing deterioration of the breakdown voltage.

Eighth Preferred Embodiment

Figure 33:
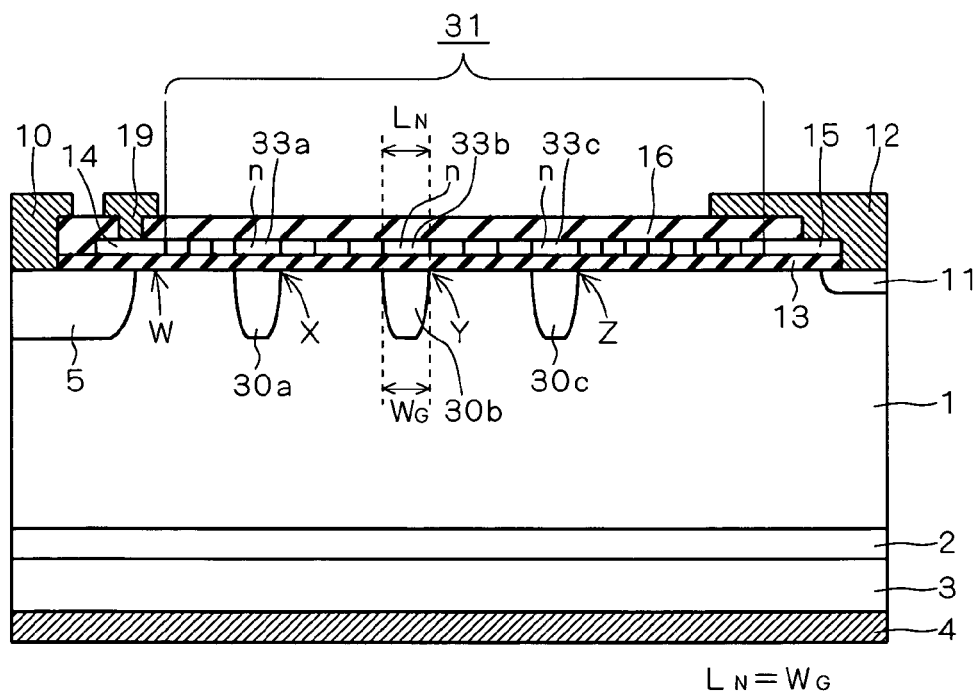
FIGS. 33 and 34 illustrate the configuration of a semiconductor device according to an eighth preferred embodiment.

In an eighth preferred embodiment of this invention, the back-to-back diode structure formed above the guard rings is optimized. FIG. 33 illustrates the configuration of a semiconductor device according to the eighth preferred embodiment, which is a cross-sectional view taken along the line A-A of FIG. 30 of the seventh preferred embodiment. As shown in FIG. 33, in the back-to-back diode 31, only n-type regions 33a, 33b, and 33c are formed above the guard rings 30a, 30b, and 30c, respectively. In other words, a pn junction in the back-to-back diode 31 is not positioned above any of the guard rings 30a, 30b, and 30c.

As discussed in the seventh preferred embodiment as well, the smaller the potential difference $V_D$ within the back-to-back diode 31 above each of the guard rings 30a, 30b, and 30c, the smaller the electric field peak at the high voltage side edge (points X, Y, and Z) of each of the guard rings 30a, 30b, and 30c.

In the back-to-back diode 31, a potential difference develops mainly at pn junctions, and the n-type regions 33a, 33b, and 33c each have a nearly constant potential inside. In the eighth preferred embodiment where only the n-type regions 33a, 33b, and 33c are formed above the guard rings 30a, 30b, and 30c, respectively, in the back-to-back diode 31, the potential difference $V_D$ within the back-to-back diode 31 above each of the guard rings 30a, 30b, and 30c is extremely small. This allows a reduction of the electric field peak at the high voltage side edge (points X, Y, and Z) of each of the guard rings 30a, 30b, and 30c, thereby achieving a high breakdown voltage in the chip peripheral portion. This in turn allows a reduction of the width on the chip peripheral portion, which helps achieve a high degree of integration and size reduction of the semiconductor device.

Figure 34:
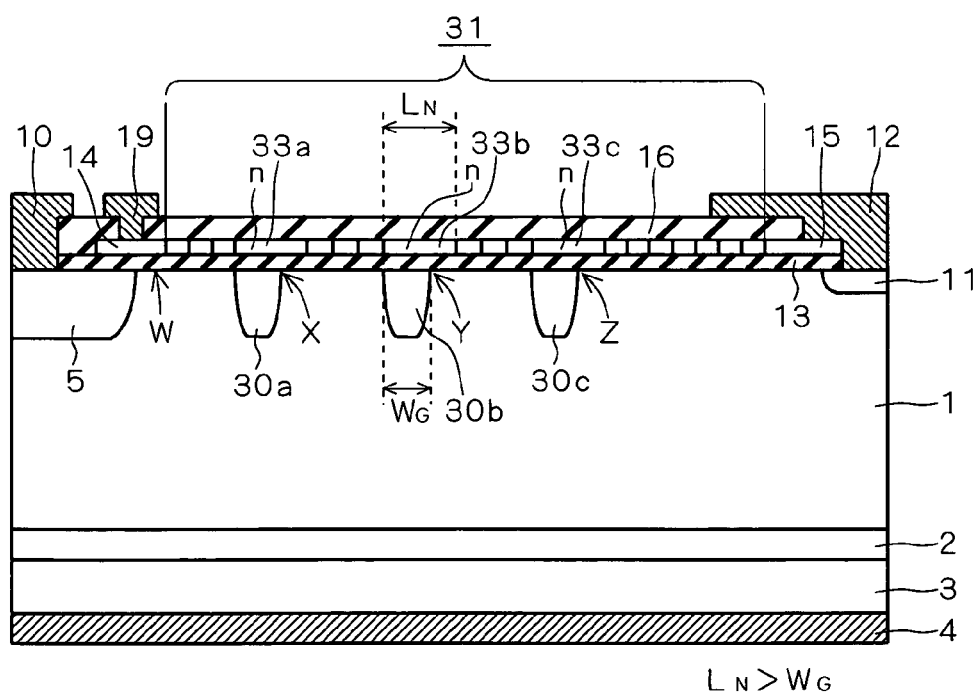

While FIG. 33 illustrates the width $W_G$ of each of the guard rings 30a, 30b, and 30c being of the same size as a length LN of each of the n-type regions 33a, 33b, and 33c formed thereabove in the back-to-back diode 31, the length $L_N$ may alternatively be made greater than the width $W_G$, and the n-type regions 33a, 33b, and 33c above the guard rings 30a, 30b, and 30c may respectively project from above the guard rings 30a, 30b, and 30c toward the high voltage side, as shown in FIG. 34. By extending the n-type regions 33a, 33b, and 33c above the guard rings 30a, 30b, and 30c on the points X, Y, and Z, respectively, the n-type regions 33a, 33b, and 33c function in the same fashion as a general field plate, thereby allowing a further reduction of the electric field peaks at the points X, Y, and Z.

The back-to-back diode 31 according to the eighth preferred embodiment can be formed in the step of forming a back-to-back diode in a method of forming a conventional semiconductor device, by changing its pattern shape. In short, there is no increase in the number of steps included in the method of manufacturing a conventional semiconductor device.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor element formed on a semiconductor substrate; and
   a peripheral structure provided around said semiconductor element,
   said peripheral structure comprising:
      a first electrode formed on a peripheral portion of said peripheral structure and electrically connected to said semiconductor substrate;
      an insulating film formed on said semiconductor substrate between a forming region of said semiconductor element and said first electrode;
      a multistage back-to-back diode formed locally in a partial region on said insulating film and extending in a first direction so as to be connected between said first electrode and a second electrode that is the outermost electrode on said semiconductor substrate in said semiconductor element;
      guard rings formed in said semiconductor substrate to surround said semiconductor element; and
      at least two impurity regions formed locally in a region including the vicinity of said back-to-back diode in said semiconductor substrate, said at least two impurity regions being formed in the first direction between an adjacent pair of said guard rings in the vicinity of said back-to-back diode such that said adjacent pair of guard rings are separated from each other in the first direction by said at least two impurity regions, said at least two impurity regions each being of a substantially linear shape extending in a second direction transverse to the first direction and of the same conductivity type as said guard rings, said substantially linear shape of each one of said at least two impurity regions not intersecting with said adjacent pair of guard rings, and said substantially linear shape of each one of said at least two impurity regions having a finite length with discrete endpoints at which said at least two impurity regions respectively terminate in said region.

2. The semiconductor device according to claim 1, wherein said substantially linear shape of each one of said at least two impurity regions is almost parallel with said guard rings.

3. The semiconductor device according to claim 1, wherein said substantially linear shape of each one of said at least two impurity regions crosses below said back-to-back diode in the second direction transverse to the first direction.

4. The semiconductor device according to claim 1, wherein said at least two impurity regions are formed only in the vicinity of said back-to-back diode between said guard rings.

5. The semiconductor device according to claim 1, wherein said at least two impurity regions are formed separated from each other in the first direction in said region, and respective intermediate portions of said at least two impurity regions are co-linear in the second direction.

6. The semiconductor device according to claim 1, wherein the finite length of at least one of said at least two impurity regions is greater than the finite length of another one of said at least two impurity regions.

* * * * *